United States Patent
Kawashima et al.

(10) Patent No.: US 7,791,121 B2
(45) Date of Patent: Sep. 7, 2010

(54) NONVOLATILE SEMICONDUCTOR MEMORY DEVICE AND METHOD FOR FABRICATING THE SAME

(75) Inventors: Koichi Kawashima, Toyama (JP); Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 26 days.

(21) Appl. No.: 12/166,069

(22) Filed: Jul. 1, 2008

(65) Prior Publication Data

US 2009/0014779 A1 Jan. 15, 2009

(30) Foreign Application Priority Data

Jul. 11, 2007 (JP) .............................. 2007-181723

(51) Int. Cl.
*H01L 27/108* (2006.01)
(52) U.S. Cl. ........................ 257/296; 257/324; 257/637; 257/E21.679; 438/261
(58) Field of Classification Search ................. 257/635, 257/637, E21.679, 296, 324; 438/261
See application file for complete search history.

(56) References Cited

U.S. PATENT DOCUMENTS

| | | | |
|---|---|---|---|
| 6,501,127 B2 * | 12/2002 | Mori ........................... 257/321 |
| 6,828,625 B2 | 12/2004 | Bloom et al. |
| 6,849,504 B2 | 2/2005 | Chang et al. |
| 6,974,989 B1 * | 12/2005 | Chen et al. ................... 257/296 |
| 7,091,088 B1 * | 8/2006 | Cheng et al. ................. 438/257 |
| 7,109,084 B2 * | 9/2006 | Lee ............................. 438/261 |
| 2006/0255398 A1 * | 11/2006 | Roizin et al. ................. 257/324 |

* cited by examiner

*Primary Examiner*—Wael M Fahmy
*Assistant Examiner*—John C Ingham
(74) *Attorney, Agent, or Firm*—McDermott Will & Emery LLP

(57) ABSTRACT

A nonvolatile semiconductor memory device includes bit line diffusion layers extending along the X direction in an upper portion of a semiconductor substrate; and gate structures extending along the Y direction on the semiconductor substrate and each including a charge trapping film and a gate electrode. The nonvolatile semiconductor memory device further includes a first interlayer insulating film in which first contacts respectively connected to the bit line diffusion layers are formed; and second contacts that penetrate through a UV blocking film and a second interlayer insulating film formed on the first interlayer insulating film and have bottom faces respectively in contact with the first contacts and top faces respectively in contact with metal interconnections.

12 Claims, 19 Drawing Sheets

US 7,791,121 B2

NONVOLATILE SEMICONDUCTOR MEMORY DEVICE AND METHOD FOR FABRICATING THE SAME

CROSS-REFERENCE TO RELATED APPLICATIONS

This application claims priority under 35 U.S.C. §119 on Patent Application No. 2007-181723 filed in Japan on Jul. 11, 2007, the entire contents of which are hereby incorporated by reference.

BACKGROUND OF THE INVENTION

The present invention relates to a nonvolatile semiconductor memory device and a method for fabricating the same, and more particularly, it relates to a MONOS (metal-oxide-nitride-oxide-semiconductor) nonvolatile semiconductor memory device and a method for fabricating the same.

In accordance with recent increase of the degree of integration and cost reduction of nonvolatile semiconductor memory devices, a MONOS memory technique in which a virtual ground type array is provided for locally trapping charge has been proposed.

A MONOS memory device has a problem that electrons are trapped by a charge trapping film owing to UV generated during fabrication process so as to disadvantageously vary the threshold voltage. Therefore, it is significant to prevent the UV generated during the fabrication process from irradiating the MONOS memory device. The UV generated during the fabrication process is, for example, plasma emission employed principally in depositing an insulating film or the like or employed in various dry etching. For example, when a carbon fluoride gas such as a $C_4F_8$ gas is used in dry etching performed for forming interconnections, an emission spectrum having a peak in the vicinity of a wavelength of 250 nm is caused, and it is reported that the threshold voltage of a MONOS memory device is varied if the MONOS memory device is fabricated without blocking this light.

Now, conventional nonvolatile semiconductor memory devices and methods for fabricating the same will be described with reference to accompanying drawings.

CONVENTIONAL EXAMPLE 1

First, Conventional Example 1 will be described with reference to FIGS. 16 and 17 (see, for example, U.S. Pat. No. 6,828,625).

FIG. 16 is a plan view of a memory cell array according to Conventional Example 1 and FIG. 17 is a cross-sectional view thereof taken on line XVII-XVII of FIG. 16. As shown in FIGS. 16 and 17, the memory cell array includes a plurality of bit line diffusion layers 103 formed in an upper portion of a P-type semiconductor substrate 101 and extending along the X direction; a plurality of gate electrodes 105 formed on the P-type semiconductor substrate 101 and respectively corresponding to word lines extending along the Y direction; and a plurality of contacts 109 each formed in a region on every bit line diffusion layer 103 sandwiched between the gate electrodes 105.

Also, as shown in FIG. 17, a charge trapping film 104 is formed between the bit line diffusion layer 103 and the gate electrode 105, and a sidewall film 106 is formed on both side faces of each gate electrode 105. A metal silicide 107 is formed in an upper portion of every gate electrode 105 and in a part of every bit line diffusion layer 103, and a first interlayer insulating film 108 is formed on the sidewall film 106 and the metal silicide 107. A second interlayer insulating film 111 is formed, with a UV blocking film 110 sandwiched therebetween, above the first interlayer insulating film 108 disposed above the gate electrodes 107. Each contact 109 electrically connected to the corresponding bit line diffusion layer 103 is formed in a region of the first interlayer insulating film 108 and the second interlayer insulating film 111 where the metal silicide 107 formed on the bit line diffusion layer 103 is exposed. At this point, the contact 109 is formed inside of an opening formed in the UV blocking film 110 to be spaced from the end of the opening of the UV blocking film 110 and has a top face connected to a metal interconnection 113 of, for example, aluminum formed on the second interlayer insulating film 111.

In this manner, in Conventional Example 1, the opening of the UV blocking film 110 is formed to be spaced from the side face of the contact 109, and hence, UV enters through this opening. Accordingly, in order to prevent the UV from entering, it is necessary to increase the distance between the opening of the UV block film 110 and a memory cell, which causes another problem that the area of the memory cell array cannot be reduced.

Furthermore, it is necessary to make the diameter of the opening of the UV blocking film 110, which is provided for separating from the contact 109, sufficiently larger than the diameter of the top face of the contact 109. This also leads to the problem of difficulty in reducing the area of the memory cell array. Moreover, since a photomask having an opening pattern for forming the opening in the UV blocking film 110 is additionally necessary, the fabrication cost is increased.

CONVENTIONAL EXAMPLE 2

Now, a nonvolatile semiconductor memory device according to Conventional Example 2 will be described with reference to FIGS. 16, 18 and 19 (see, for example, U.S. Pat. No. 6,849,504).

FIG. 18 is a cross-sectional view of the nonvolatile semiconductor memory device taken on line XVIII-XVIII of FIG. 16 and FIG. 19 is a cross-sectional view thereof taken on line XIX-XIX of FIG. 16. In Conventional Example 2, like reference numerals are used to refer to like elements included in the memory device of Conventional Example 1.

As shown in FIGS. 18 and 19, the nonvolatile semiconductor memory device of Conventional Example 2 includes a contact 109 penetrating through both a first interlayer insulating film 108 and a UV blocking film 110 and connected to a metal interconnection 113 directly formed on the UV blocking film 110.

In this manner, since an opening is formed in the UV blocking film 110 by using a mask for forming the contact 109 in Conventional Example 2, this nonvolatile memory device is better than that of Conventional Example 1 because UV can be prevented from entering through a gap between the contact 109 and the UV blocking film 110.

In the fabrication process of the nonvolatile semiconductor memory device of Conventional Example 2, however, in order to form the contact 109, a tungsten film is deposited over the UV blocking film 110 by chemical vapor deposition (CVD) and a portion of the deposited tungsten film not corresponding to the contact is removed by chemical mechanical polishing (CMP). Therefore, in removing the portion of the tungsten film formed on the UV blocking film 110, there arises a problem that the UV blocking film 110 is simultaneously partly removed.

Furthermore, in refinement process recently performed, a copper interconnection formed by a damascene method is used as the metal interconnection 113 instead of an aluminum interconnection formed by sputtering.

Now, problems arising in forming the metal interconnection 113 of copper by the damascene method will be described with reference to FIGS. 20 and 21.

First, as shown in FIG. 20, a second interlayer insulating film 111 is formed over a UV blocking film 110 including respective contacts 109, and then, grooves are formed in portions of the second interlayer insulating film 111 including the contacts 109. At this point, the UV blocking layer 110 is simultaneously partly removed, and exposed regions 108a are formed in a first interlayer insulating film 108. A memory cell is irradiated with UV through this exposed region 108a.

Next, as shown in FIG. 21, when a metal interconnection 113 is deposited by copper plating over the first interlayer insulating film 108 having the grooves, the memory cell is irradiated with UV in the copper plating through the exposed region 108a of the first interlayer insulating film 108 formed in the process shown in FIG. 20.

In this manner, in Conventional Example 2, the UV blocking film 110 cannot be formed into a stable thickness, and when the metal interconnection is formed by the damascene method, there arises a problem that the UV blocking film 110 is partly removed below the metal interconnection.

SUMMARY OF THE INVENTION

In consideration of the aforementioned conventional problems, an object of the invention is stably forming a UV blocking film for protecting a memory cell from UV in a MONOS nonvolatile semiconductor memory device.

In order to achieve the object, the nonvolatile semiconductor memory device according to the present invention includes a first interlayer insulating film in which first contacts respectively connected to bit line diffusion layers are formed and second contacts respectively connected to the first contacts through a UV blocking film and a second interlayer insulating film formed on the first interlayer insulating film.

Specifically, the nonvolatile semiconductor memory device of this invention includes a plurality of bit line diffusion layers formed selectively in an upper portion of a semiconductor region and extending along a first direction; a plurality of gate structures formed on the semiconductor region, extending along a second direction perpendicular to the first direction and each containing a charge trapping film including an insulating film for trapping charge and a gate electrode formed on the charge trapping film; a first interlayer insulating film formed over the plurality of gate structures and having a plurality of openings in which the plurality of bit line diffusion layers are respectively exposed; a plurality of first contacts respectively formed in the openings of the first interlayer insulating film and respectively electrically connected to the plurality of bit line diffusion layers; a UV blocking film formed over the first interlayer insulating film and having a plurality of openings in which the plurality of first contacts are respectively exposed; a second interlayer insulating film formed at least over the UV blocking film and having a plurality of openings in which the plurality of first contacts are respectively exposed; and a plurality of second contacts respectively formed in the plurality of openings of the second interlayer insulating film and the plurality of openings of the UV blocking film and respectively electrically connected to the plurality of first contacts.

In the nonvolatile semiconductor memory device of this invention, each contact electrically connected to the corresponding bit line diffusion layer formed in the upper portion of the semiconductor region has a two-layered structure of the first contact formed in the first interlayer insulating film and the second contact formed in the UV blocking film and the second interlayer insulating film formed on the first interlayer insulating film. Therefore, since the UV blocking film is formed after forming the first contact disposed in the lower layer is formed, the UV blocking film is never reduced in the thickness in forming the first contact. Furthermore, since the metal interconnection is formed on the second contact formed in the second interlayer insulating film disposed in the upper layer, the UV blocking film is protected by the second interlayer insulating film in forming the metal interconnection, and therefore, there arises no problem such as removal of the UV blocking film. As a result, the UV blocking film can be stably formed.

In the nonvolatile semiconductor memory device of the invention, a bottom face of each of the plurality of second contacts is preferably disposed in a position included in a top face of a corresponding one of the plurality of first contacts.

The nonvolatile semiconductor memory device of the invention preferably further includes inner lining films that are formed on inner walls of at least the plurality of openings of the UV blocking film out of the plurality of openings of the second interlayer insulating film and the plurality of openings of the UV blocking film for separating the UV blocking film from the plurality of first contacts and the plurality of second contacts. Thus, the UV blocking film can be made of a conducting material.

In this case, the UV blocking film preferably includes at least two layers having different compositions, and a lowermost layer of the at least two layers is preferably made of an insulating material.

Also in this case, the lowermost layer of the UV blocking film may be made of a single-layered film of silicon carbide, silicon nitride, silicon carbon nitride or silicon oxy-nitride or a multilayered film including at least two of silicon carbide, silicon nitride, silicon carbon nitride and silicon oxy-nitride.

Also in this case, a layer apart from the lowermost layer of the UV blocking film including the at least two layers is preferably made of a conducting material.

Also in this case, the layer apart from the lowermost layer of the UV blocking film may be made of one of or a compound including at least two of silicon, tungsten, titanium, titanium nitride, aluminum, tantalum, ruthenium, vanadium and manganese.

In the case where the nonvolatile semiconductor memory device of this invention includes the inner lining films formed on the inner walls of at least the openings of the UV blocking film, the inner lining films are preferably made of an insulating material having a UV blocking property.

In this case, the inner lining films may be made of a single-layered film of silicon carbide, silicon nitride, silicon carbon nitride or silicon oxy-nitride or a multilayered film including at least two of silicon carbide, silicon nitride, silicon carbon nitride and silicon oxy-nitride.

Also in this case, each of the inner lining films preferably has a bottom face with an outer periphery thereof disposed outside a top face of a corresponding one of the plurality of first contacts. Thus, the UV blocking film can be definitely insulated from the first contacts even if the UV blocking film is made of a conducting material.

In the case where the lowermost layer of the UV blocking film is made of an insulating film, each of the inner lining films preferably has a bottom face with an outer periphery thereof disposed inside a top face of a corresponding one of the plurality of first contacts. Thus, the diameter of each second contact formed on the corresponding first contact can be reduced, and hence, the memory device is advantageous to refinement.

Each of the inner lining films preferably has a thickness not less than 5 nm and not more than 50 nm.

In the nonvolatile semiconductor memory device of the invention, the charge trapping film preferably includes a multilayered film of silicon oxide and silicon nitride.

In the nonvolatile semiconductor memory device of the invention, the UV blocking film may be made of at least one of polysilicon, silicon carbide and silicon nitride.

In the case where the nonvolatile semiconductor memory device of this invention includes the inner lining films formed on the inner walls of at least the UV blocking film, the UV blocking film may be made of one of or a compound including at least two of silicon, tungsten, titanium, titanium nitride, aluminum, tantalum, ruthenium, vanadium and manganese.

The method for fabricating a nonvolatile semiconductor memory device of this invention includes a first step of selectively forming, in an upper portion of a semiconductor region, a plurality of bit line diffusion layers extending along a first direction; a second step of forming, on the semiconductor region, a plurality of gate structures extending along a second direction perpendicular to the first direction by successively forming a charge trapping film including an insulating film for trapping charge and a gate electrode on the charge trapping film; a third step of forming a first interlayer insulating film over the plurality of gate structures; a fourth step of selectively forming, in the first interlayer insulating film, a plurality of openings in which the bit line diffusion layers are respectively exposed and forming, respectively in the plurality of openings, a plurality of first contacts respectively electrically connected to the plurality of bit line diffusion layers; a fifth step of forming a UV blocking film for blocking UV over the first interlayer insulating film including the plurality of first contacts; a sixth step of forming a second interlayer insulating film on the UV blocking film; and a seventh step of selectively forming, in the second interlayer insulating film and the UV blocking film, a plurality of openings in which the plurality of first contacts are respectively exposed and forming, respectively in the plurality of openings, a plurality of second contacts respectively electrically connected to the plurality of first contacts.

In the method for fabricating a nonvolatile semiconductor memory device of this invention, the first contacts are formed in the first interlayer insulating film disposed in a lower layer, and thereafter, the UV blocking film is formed on the first interlayer insulating film and the first contacts. Therefore, the thickness of the UV blocking film is never reduced in the fourth step where the first contacts are formed. Furthermore, when a procedure for, for example, forming a metal interconnection is performed after forming the second contacts in the second interlayer insulating film disposed in an upper layer, the UV blocking film is covered with the second interlayer insulating film in the procedure for forming a metal interconnection, and hence, the UV blocking film is never reduced in the thickness or removed. Accordingly, since the UV blocking film can be stably formed, the charge trapping film can be definitely protected from irradiation with UV generated during the fabrication process.

In the method for fabricating a nonvolatile semiconductor memory device of this invention, the seventh step preferably includes a sub-step of electrically separating the plurality of first contacts from the UV blocking film by forming inner lining films on inner walls of at least the plurality of openings of the UV blocking film out of the plurality of openings of the second interlayer insulating film and the plurality of openings of the UV blocking film. Thus, the UV blocking film can be made of a conducting material, and hence, the UV blocking film can be formed in a smaller thickness.

In this case, the fourth step and the fifth step are preferably continuously performed by using a conducting material used for the plurality of first contacts for forming the UV blocking film.

Also in this case, in the seventh step, bottoms of the plurality of openings of the second interlayer insulating film and the UV blocking film in which the plurality of first contacts are respectively exposed are preferably formed in such a manner that portions of the first interlayer insulating film disposed in peripheries of the plurality of first contacts are exposed.

Furthermore, in the case where the inner lining films are formed, in the fifth step, the UV blocking film is preferably formed as a multilayered film including at least two layers having different compositions, a lowermost layer of the multilayered film is preferably made of an insulating material and a layer apart from the lowermost layer of the multilayered film is preferably made of a conducting material.

In this case, the lowermost layer of the UV blocking film may be made of a single-layered film of silicon carbide, silicon nitride, silicon carbon nitride or silicon oxy-nitride or a multilayered film of at least two of silicon carbide, silicon nitride, silicon carbon nitride and silicon oxy-nitride, and the layer apart from the lowermost layer of the UV blocking film may be made of one of or a compound including at least two of silicon, tungsten, titanium, titanium nitride, aluminum, tantalum, ruthenium, vanadium and manganese.

In the case where the UV blocking film is a multilayered film including a lowermost layer made of an insulating film, in the seventh step, each of the plurality of openings of the second interlayer insulating film and the UV blocking film in which the plurality of first contacts are preferably respectively exposed is formed in such a manner as to have a bottom disposed inside a top face of a corresponding one of the plurality of first contacts.

In the method for fabricating a nonvolatile semiconductor memory device of this invention, the charge trapping film preferably includes a multilayered film of silicon oxide and silicon nitride in the second step.

In the method for fabricating a nonvolatile semiconductor memory device of this invention, a photomask used in patterning the plurality of first contacts in the fourth step and a photomask used in patterning the plurality of second contacts in the seventh step are preferably identical to each other.

In the method for fabricating a nonvolatile semiconductor memory device of this invention, the UV blocking film may be made of at least one of polysilicon, silicon carbide and silicon nitride in the fifth step.

In the method for fabricating a nonvolatile semiconductor memory device of this invention, the UV blocking film may be made of one of or a compound including at least two of silicon, tungsten, titanium, titanium nitride, aluminum, tantalum, ruthenium, vanadium and manganese in the fifth step.

In this case, the inner lining films may be made of a single-layered film of silicon carbide, silicon nitride, silicon carbon nitride or silicon oxy-nitride or a multilayered film of at least two of silicon carbide, silicon nitride, silicon carbon nitride and silicon oxy-nitride in the seventh step.

As described so far, according to the nonvolatile semiconductor memory device and the method for fabricating the same of the invention, the UV blocking film formed above the charge trapping film can be stably formed, and therefore, the charge trapping film can be definitely protected from irradiation with UV generated during the fabrication process.

Accordingly, variation of the threshold voltage derived from the fabrication process can be prevented in a MONOS memory device.

DETAILED DESCRIPTION OF THE INVENTION

Embodiment 1

Embodiment 1 of the invention will now be described with reference to the accompanying drawings.

Figure 1:
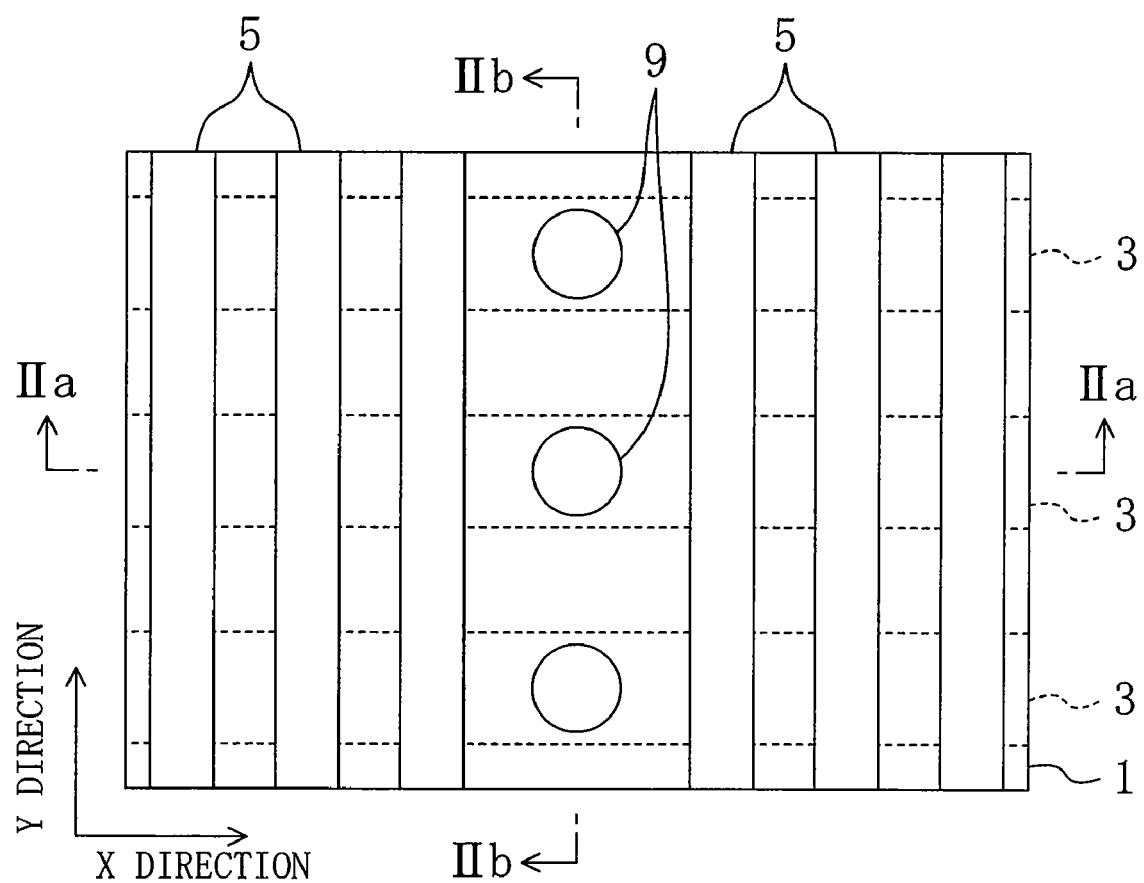
FIG. 1 is a plan view of a memory cell array included in a nonvolatile semiconductor memory device according to Embodiment 1 of the invention taken on line I-I of FIG. 2A.
Figure 2A:
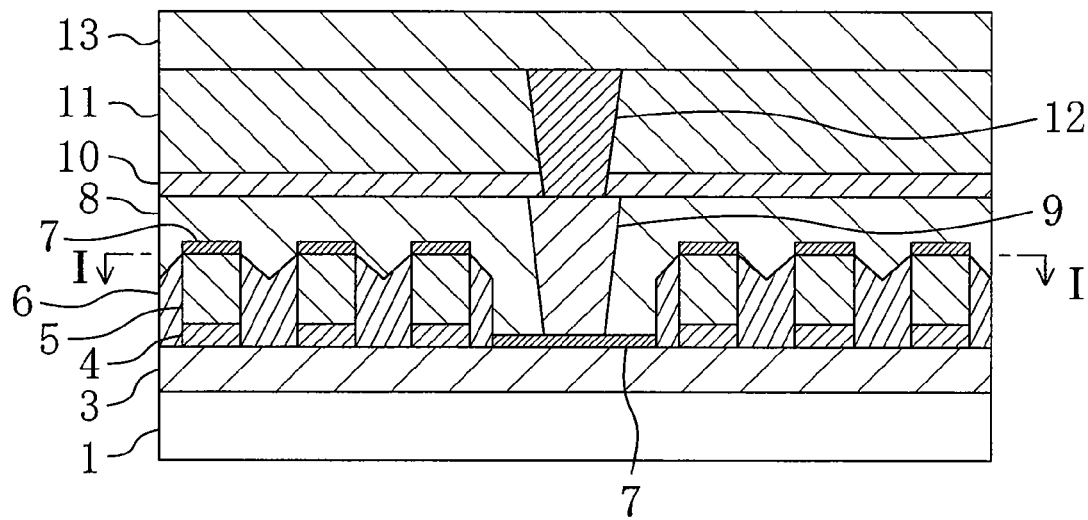
FIG. 2A is a cross-sectional view taken on line IIa-IIa of FIG. 1
Figure 2B:
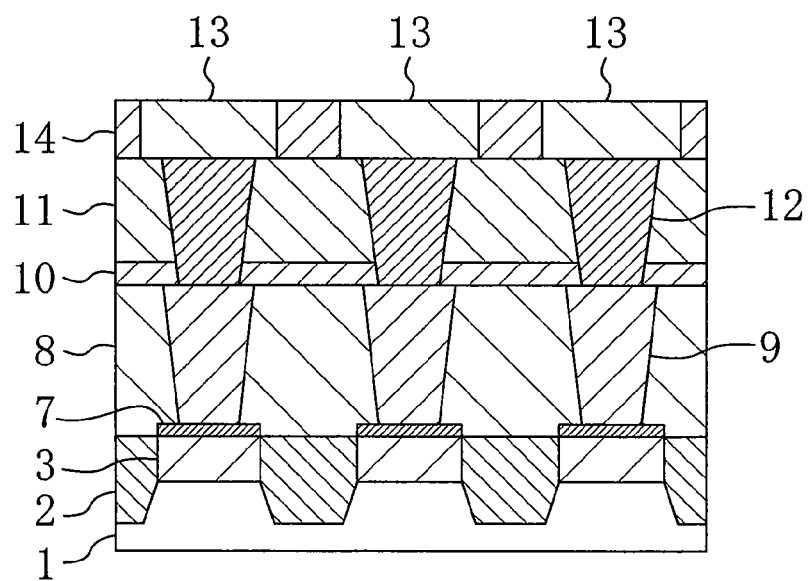
FIG. 2B is a cross-sectional view taken on line IIb-IIb of FIG. 1.

FIG. 1 shows the plane structure of a memory cell array included in a nonvolatile semiconductor memory device according to Embodiment 1 of the invention, FIG. 2A shows the cross-sectional structure thereof taken on line IIa-IIa of FIG. 1 and FIG. 2B shows the cross-sectional structure thereof taken on line IIb-IIb of FIG. 1. It is noted that FIG. 1 is a plan view taken on line I-I of FIG. 2A.

As shown in FIGS. 1, 2A and 2B, the memory cell array includes a plurality of bit line diffusion layers 3 formed in an upper portion of a semiconductor substrate 1 of, for example, P-type silicon (Si) to be isolated from one another by an isolation film 2 and to extend along the X direction; a plurality of gate electrodes 5 formed on the semiconductor substrate 1 and respectively corresponding to word lines extending along the Y direction; and a plurality of first contacts 9 formed respectively on the bit line diffusion layers 3 in regions sandwiched between the gate electrodes 5. It is noted that the bit line diffusion layers 3 need not be always formed in the semiconductor substrate 1 and may be formed in any semiconductor region of, for example, P-type silicon instead of the semiconductor substrate.

As shown in FIG. 2A, each bit line diffusion layer 3 is formed in an upper portion of the semiconductor substrate 1, a charge trapping film 4 is formed between the bit line diffusion layer 3 and the gate electrode 5, and an insulating sidewall film 6 is formed on the side face of the gate electrode 5. A metal silicide 7 is formed in an upper portion of the gate electrode 5 and in a part of the bit line diffusion layer 3, and a first interlayer insulating film 8 is formed on the sidewall film 6 and the metal silicide 7. At this point, the charge trapping film 4 and the gate electrode 5 together form a gate structure.

A UV blocking film 10 is formed over the first interlayer insulating film 8 and the first contacts 9, and a second interlayer insulating film 11 is formed on the UV blocking film 10. A second contact 12 electrically connected to each first contact 9 is formed in a region of the second interlayer insulating film 11 and the UV blocking film 10 where the first contact 9 is exposed. The second contact 12 is connected to each metal interconnection 13 of, for example, aluminum (Al) selectively formed on the second interlayer insulating film 11.

Furthermore, as shown in FIG. 2B, the plural metal interconnections 13 are formed in respective grooves of a metal interconnection insulating film 14 formed on the second interlayer insulating film 11 and having the plural grooves where the second contacts 12 are exposed.

As shown in FIGS. 2A and 2B, as a characteristic of Embodiment 1, each second contact 12 formed on the first contact 9 penetrates through the UV blocking film 10 and the top face of the first contact 9 is in contact with a peripheral portion of the corresponding opening of the UV blocking film 10.

In FIG. 1, the first interlayer insulating film 8 and the sidewall film 6 are omitted to be shown on and below each gate electrode 5 for the sake of convenience.

In the case where fabrication process of 90 nm level is assumed as the design rule, the bit line diffusion layer 3 is an N-type layer having a width of 90 nm and a depth of 40 nm and doped with arsenic (As). The charge trapping film 4 is made of what is called an ONO film including a silicon oxide film with a thickness of 5 nm, a silicon nitride film with a thickness of 10 nm and a silicon oxide film with a thickness of 10 nm successively formed in this order above the substrate. The gate electrode 5 is made of polysilicon with a width and an interval of 90 nm. The sidewall film 6 is made of silicon nitride with a thickness of approximately 80 nm and is actually buried in a space between the gate electrodes because the space between the gate electrodes 5 is actually small. The metal silicide 7 is made of, for example, cobalt silicide (CoSi) or titanium silicide (TiSi) with a thickness of approximately 30 nm. Each of the first interlayer insulating film 8 and the second interlayer insulating film 11 is made of NSG (non-doped silicon glass) with a thickness of 400 nm. Each of the first contacts 9 and the second contacts 12 is made of tungsten (W) having a diameter of 90 nm on the top face and covered with a barrier layer of titanium nitride (TiN) on the side face thereof.

The UV blocking film 10 is made of at least one of polysilicon (PS), silicon carbide (SiC) and silicon nitride (SiN) with a thickness of, for example, 50 nm.

The metal interconnection 13 is made of copper with a width of 90 nm and is formed by the damascene method or the plating.

It is noted that the aforementioned structure is merely illustratively described and other materials and formation methods may be employed instead.

Now, a method for fabricating the nonvolatile semiconductor memory device having the aforementioned structure will be described with reference to the accompanying drawings.

FIGS. 3A through 3C, 4A, 4B, 5A, 5B, 6A and 6B are cross-sectional views of a region including a memory cell array for showing procedures in the method for fabricating the nonvolatile semiconductor memory device of this embodiment. FIGS. 3A through 4B show the cross-sectional structures taken on line IIa-IIa of FIG. 1, and FIGS. 5A through 6B show the cross-sectional structures taken on line IIb-IIb of FIG. 1.

Figure 3A:
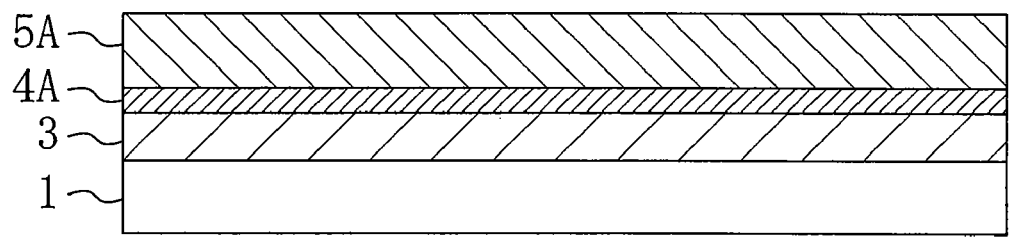
FIGS. 3A, 3B and 3C are cross-sectional views taken along a direction corresponding to line IIa-IIa of FIG. 1 for showing procedures in a method for fabricating the nonvolatile semiconductor memory device of Embodiment 1.

First, as shown in FIG. 3A, a plurality of bit line diffusion layers 3 extending along the X direction are selectively formed in an upper portion of a semiconductor substrate 1 of P-type silicon. Thereafter, an ONO film 4A having the aforementioned structure is formed, and a polysilicon film 5A for forming gate electrodes is deposited on the ONO film 4A.

Figure 3B:
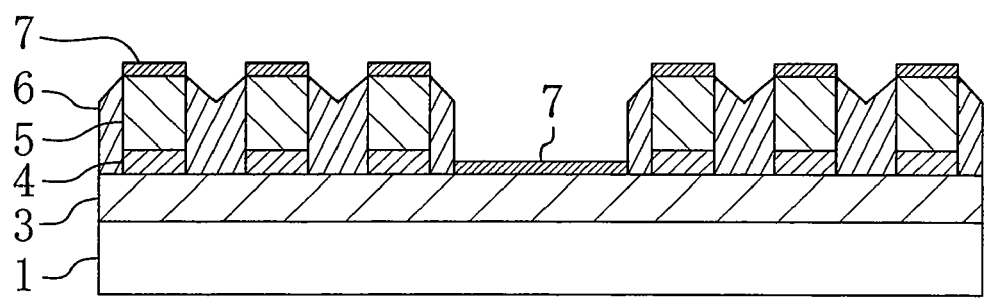

Next, as shown in FIG. 3B, the polysilicon film 5A is patterned into a plurality of gate electrodes 5 by using a gate electrode forming mask, and subsequently, the ONO film 4A is patterned into a plurality of charge trapping films 4 in the same shape as the gate electrodes 5. Thereafter, a silicon nitride film is deposited over the semiconductor substrate 1, and the silicon nitride film is etched back so as to form sidewall films 6 of silicon nitride on the side faces of the gate electrodes and the charge trapping films 4. At this point, in a region on the bit line diffusion layer 3 where a first contact 9 is to be formed, a distance between the adjacent gate electrodes 5 is so large that the bit line diffusion layer 3 is exposed between the opposing sidewall films 6. On the contrary, in other regions, the distance between the adjacent gate electrodes 5 is so small that the region is filled by the sidewall film 6 as described above. Then, a metal silicide 7 of cobalt silicide or titanium silicide is selectively formed on the top face of each gate electrode 5 and on a portion of the bit line diffusion layer 6 exposed from the sidewall film 6.

Figure 3C:
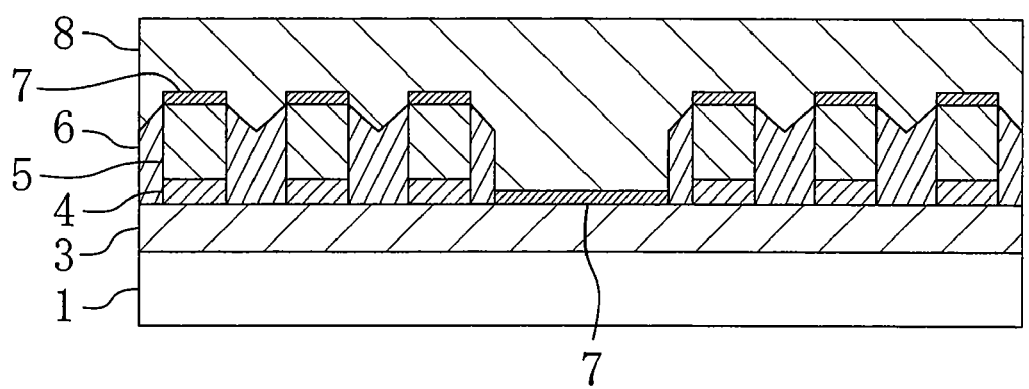

Next, as shown in FIG. 3C, a first interlayer insulating film 8 of NSG is formed over the semiconductor substrate 1 including the top faces of the gate electrodes 5 and the metal silicides 7 formed on the exposed portions of the bit line diffusion layers 6. Subsequently, the top face of the first interlayer insulating film 8 is planarized by, for example, chemical mechanical polishing (CMP).

Figure 4A:
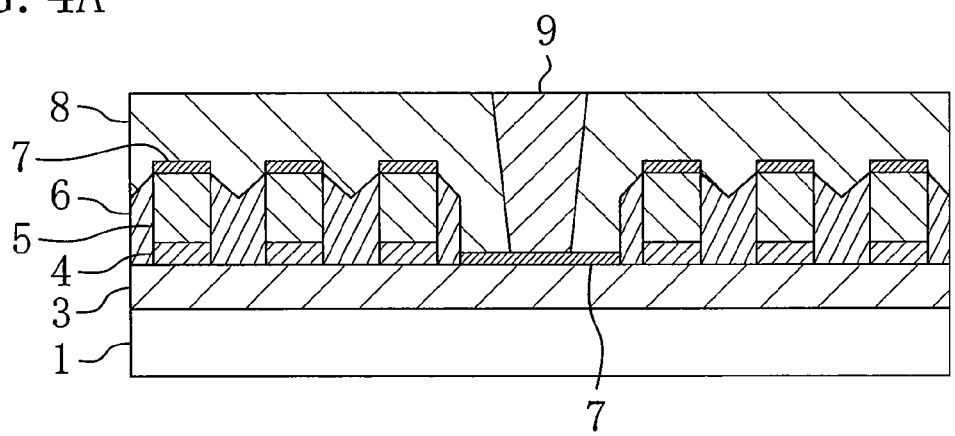
FIGS. 4A and 4B are cross-sectional views taken along the direction corresponding to line IIa-IIa of FIG. 1 for showing other procedures in the method for fabricating the nonvolatile semiconductor memory device of Embodiment 1.

Next, as shown in FIG. 4A, openings in each of which the metal silicide 7 formed on the bit line diffusion layer 3 is exposed are formed in the first interlayer insulating film 8 by using a first contact forming mask (not shown). Subsequently, tungsten (W) is deposited so as to fill the openings of the first interlayer insulating film 8, and thus, first contacts 9 made of tungsten are formed above the bit line diffusion layers 3 by CVD or the like. At this point, an unnecessary portion of the tungsten deposited on the first interlayer insulating film 8 is removed by the CMP or the like.

Figure 4B:
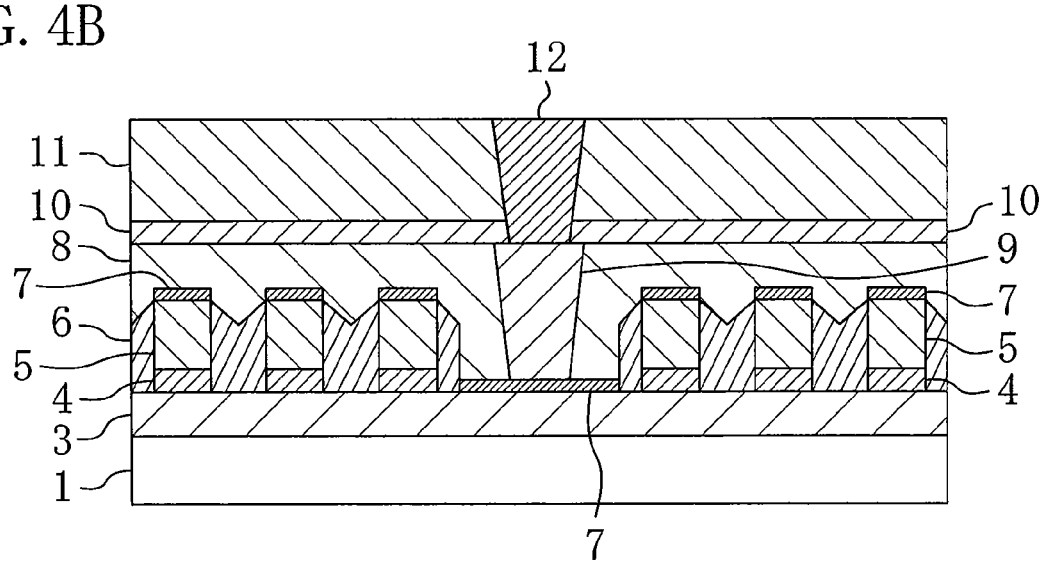
Figure 5A:
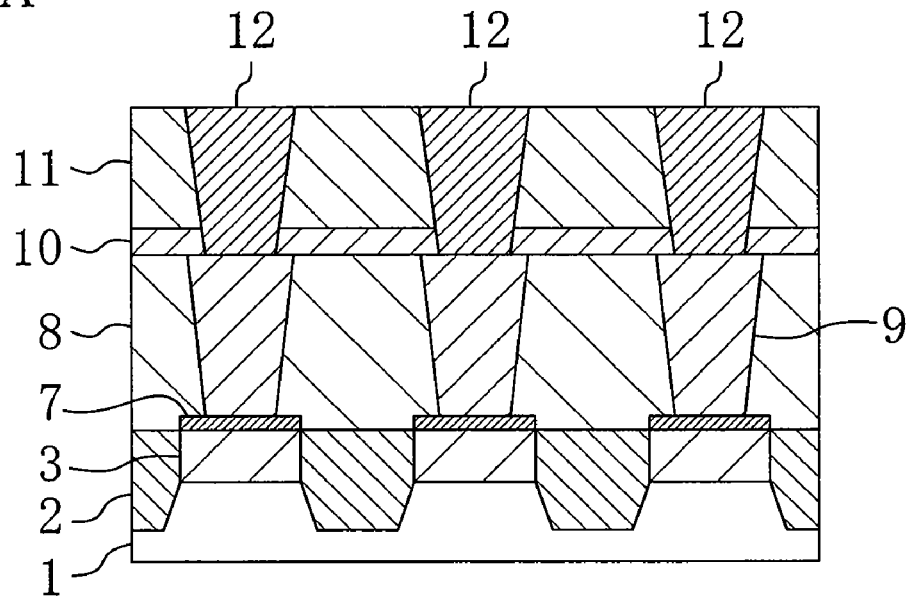
FIGS. 5A and 5B are cross-sectional views taken along a direction corresponding to line IIb-IIb of FIG. 1 for showing procedures performed after the procedures of FIGS. 4A and 4B in the method for fabricating the nonvolatile semiconductor memory device of Embodiment 1.

Next, as shown in FIG. 4B, a UV blocking film 10 of, for example, undoped polysilicon and a second interlayer insulating film 11 of NSG are successively deposited on the first interlayer insulating film 8 having the first contacts 9. It is noted that another insulating film made of, for example, silicon nitride and working as an etching stopper film may be formed on the first interlayer insulating film 8 including the first contacts 9 before forming the UV blocking film 10. Subsequently, openings in each of which the first contact 9 formed in the first interlayer insulating film 8 is exposed are formed successively in the second interlayer insulating film 11 and the UV blocking film 10 by using a second contact forming mask (not shown). Thereafter, tungsten is deposited so as to fill the openings of the second interlayer insulating film 11 and the UV blocking film 10, and thus, second contacts 12 of tungsten are formed. Also in this case, an unnecessary portion of the tungsten deposited on the second interlayer insulating film 11 is removed by the CMP or the like. At this point, FIG. 5A shows a cross-sectional structure taken on line IIb-IIb of FIG. 1 obtained immediately after forming the second contacts 12 in the second interlayer insulating film 8 and the UV blocking film 10.

The mask (photomask) used for forming the second contacts 12 is preferably the same as the mask (photomask) used for forming the first contacts 9. Since a contact forming mask is generally expensive, a structure in which the first contacts 9 and the second contacts 12 can be formed by using the same mask is preferred from the viewpoint of fabrication cost reduction. Furthermore, when the same mask is used, an alignment shift derived from the fabrication of a mask can be avoided, and hence, the accuracy in aligning the second contacts 12 on the first contacts 9 is improved. At this point, the bottom face of each second contact 12 is preferably formed to be included within the top face of the corresponding first contact 9. Thus, UV generated in etching performed for forming the opening for forming the second contact 12 in the second interlayer insulating film 11 can be prevented from reaching a memory cell.

Figure 5B:
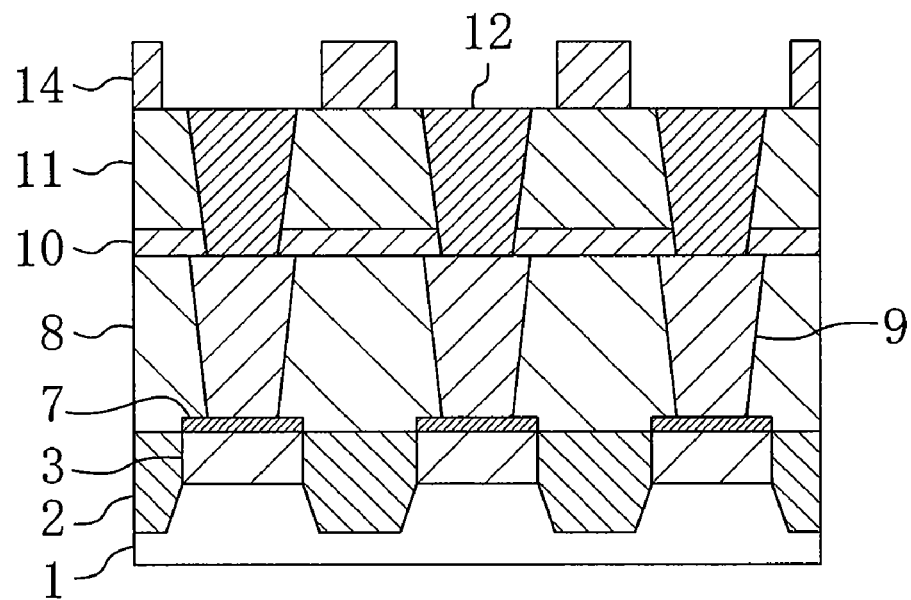

Next, as shown in FIG. 5B, a metal interconnection insulating film 14 made of, for example, silicon oxy-carbide and having an opening pattern corresponding to an interconnection pattern is formed on the second interlayer insulating film 11. At this point, the opening pattern is formed so as to expose the respective second contacts 12. The metal interconnection insulating film 14 may be made of a plurality of insulating films having different compositions such as silicon oxy-carbide and silicon carbon nitride.

Figure 6A:
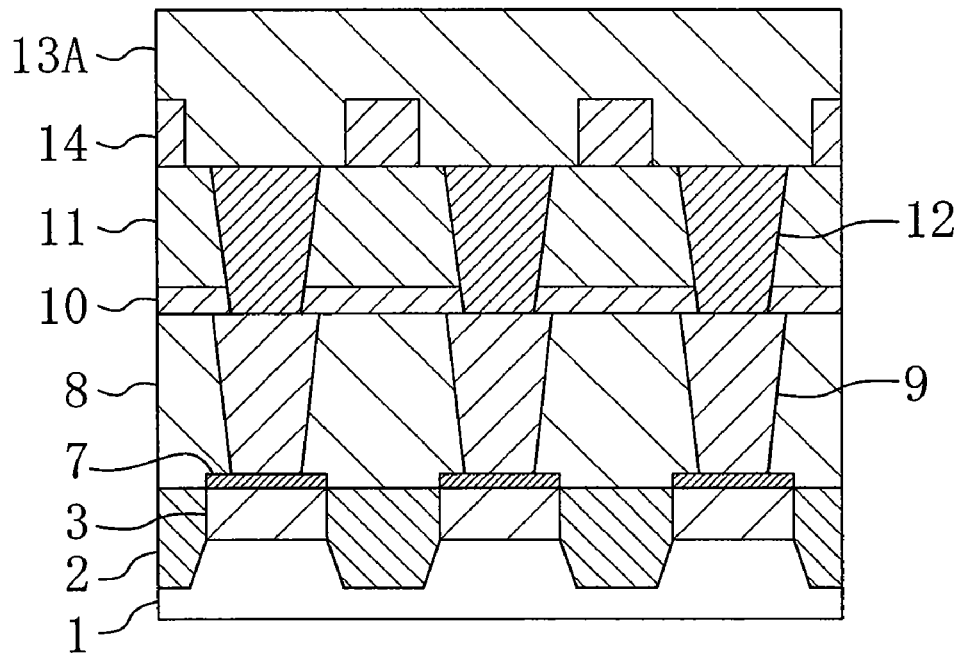
FIGS. 6A and 6B are cross-sectional views for showing procedures performed after the procedures of FIGS. 5A and 5B in the method for fabricating the nonvolatile semiconductor memory device of Embodiment 1.

Next, as shown in FIG. 6A, a metal film 13A of copper for forming metal interconnections is deposited over the second interlayer insulating film 11 including the metal interconnection insulating film 14 by the copper plating.

Figure 6B:
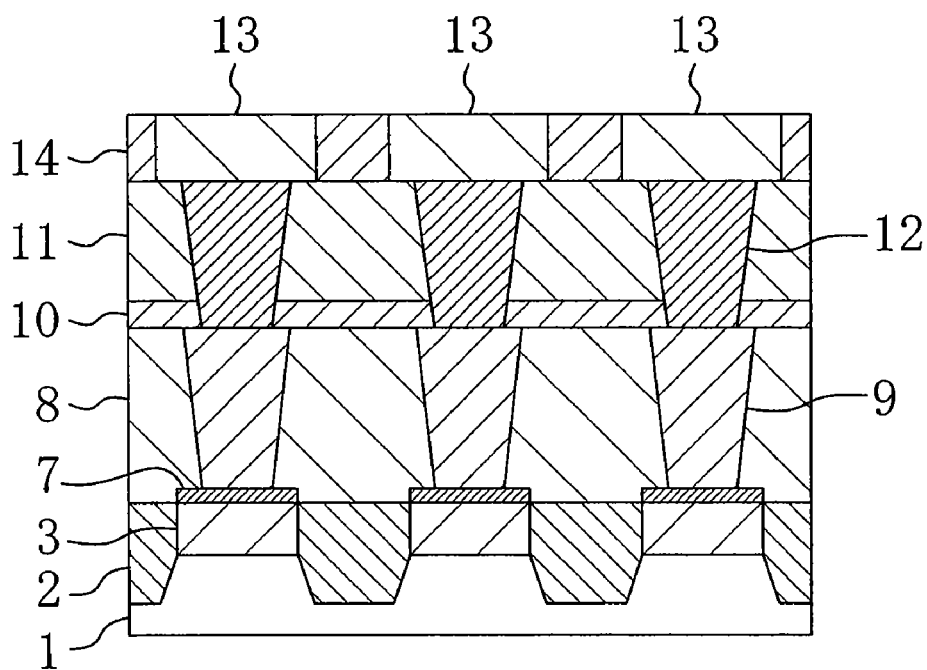

Then, as shown in FIG. 6B, the metal film 13A is polished and removed by, for example, the CMP until the metal interconnection insulating film 14 is exposed, and thus, the metal film 13A is formed into metal interconnections 13 in an opening pattern formed in the metal interconnection insulating film 14. Although the metal interconnections 13 are formed as copper interconnections obtained by the damascene method in Embodiment 1, aluminum interconnections obtained by sputtering may be employed instead.

As described above, each contact for electrically connecting the bit line diffusion layer 3 formed in the upper portion of the semiconductor substrate 1 and the metal interconnection 13 is formed dividedly as the first contact 9 and the second contact 12, and the second contact 12 is formed by directly forming an opening in the UV blocking film 10. Therefore, there is no gap formed in the UV blocking film 10 from the first contact 9. As a result, there is no need to provide an additional interval between the first contact 9 and the memory cell, and hence, the refinement can be easily attained. In addition, since the UV blocking film 10 is not removed in forming the first contact 9 and the metal interconnection 13, the UV blocking film 10 can be stably formed.

As a first comparative example, the following method can be presumed: In Conventional Example 1 shown in FIG. 17, the UV blocking film 110 is not previously processed but the second interlayer insulating film 111 is subsequently formed on the UV blocking film 110, and each contact 109 is formed by successively patterning the second interlayer insulating film 111, the UV blocking film 110 and the first interlayer insulating film 108. This method is, however, not suitable for the refinement because the aspect ratio of the contact 109 is large and there arises a problem that the shape of the contact is degraded.

Figure 17:
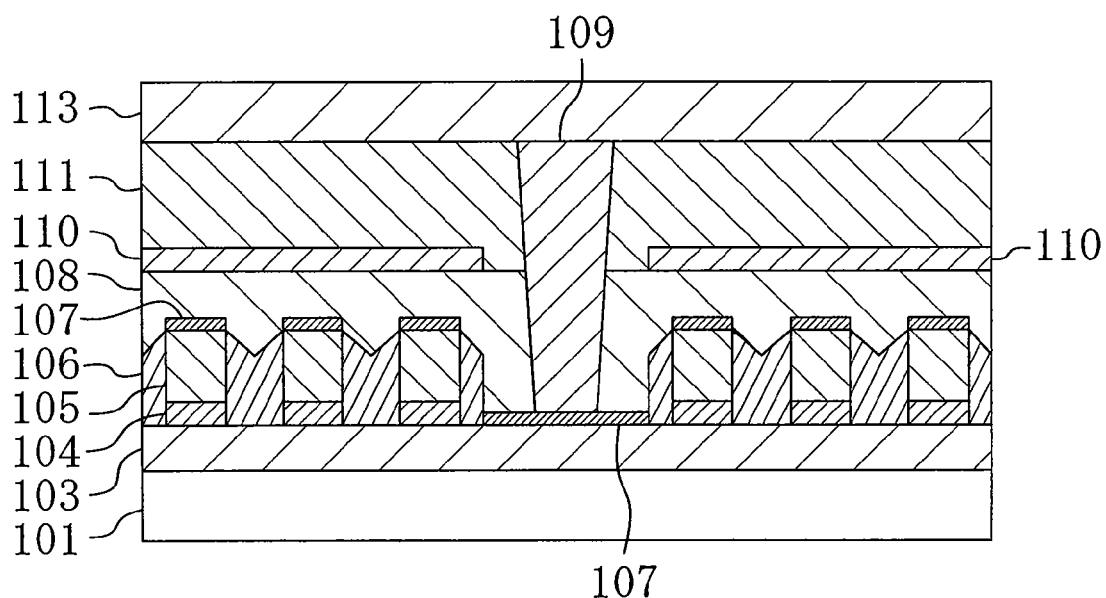
FIG. 17 is a cross-sectional view taken on line XVII-XVII of FIG. 16.
Figure 18:
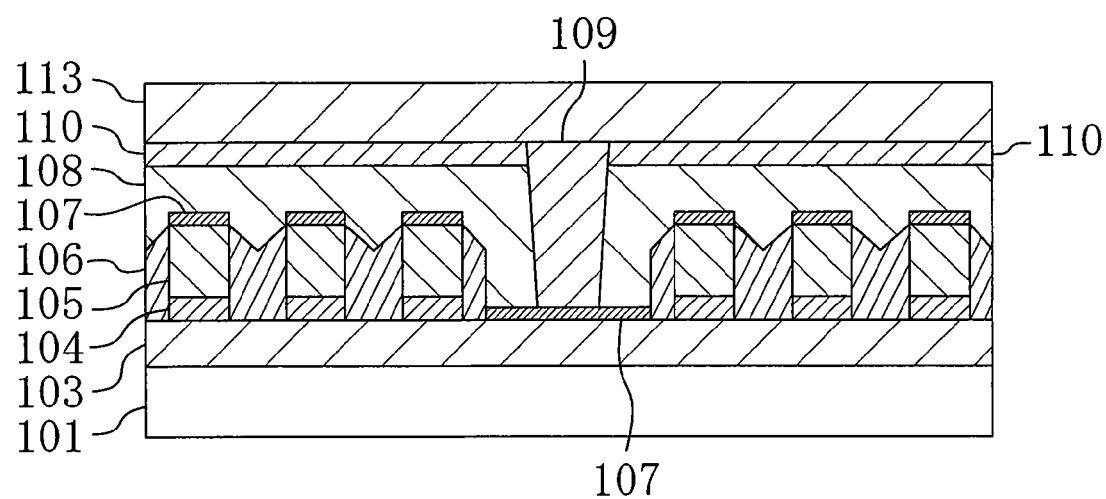
FIG. 18 is a cross-sectional view of a memory cell array according to Conventional Example 2 taken on line XVIII-XVIII of FIG. 16.
Figure 19:
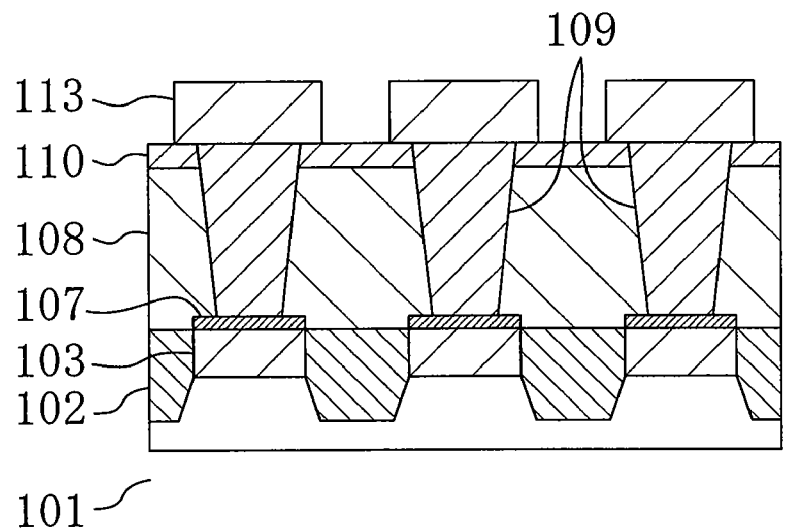
FIG. 19 is a cross-sectional view of the memory cell array of Conventional Example 2 take on line XIX-XIX of FIG. 16.
Figure 20:
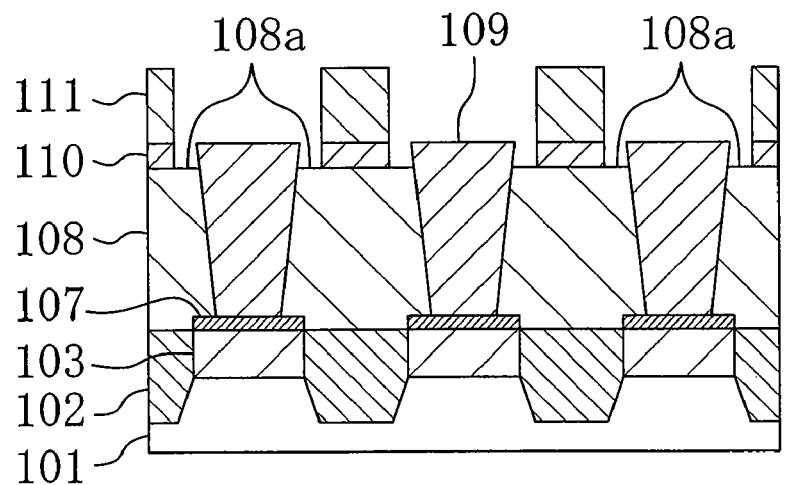
FIG. 20 is a cross-sectional view taken along a direction corresponding to line XIX-XIX of FIG. 16 for showing a procedure in a method for fabricating the memory cell array of Conventional Example 2.
Figure 21:
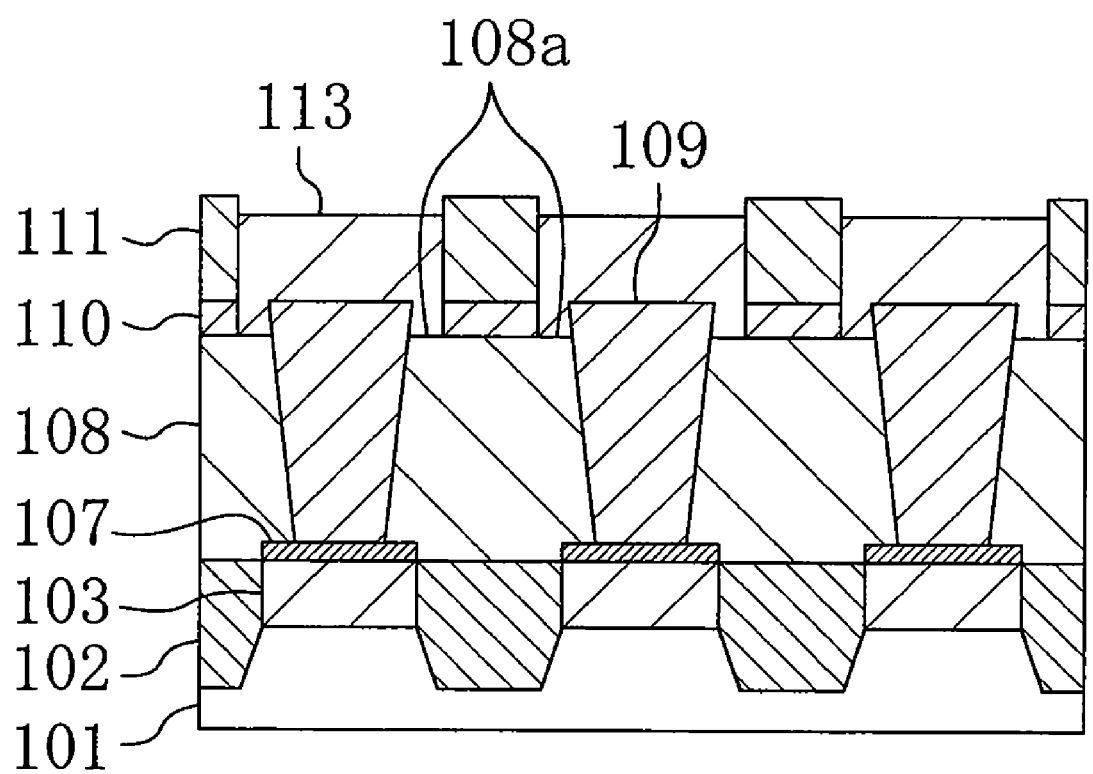
FIG. 21 is a cross-sectional view for showing a procedure performed after the procedure of FIG. 20 in the method for fabricating the memory cell array of Conventional Example 2.

Alternatively, as a second comparative example, the following method can be presumed: The UV blocking film 110 of FIG. 17 is not previously processed but the UV blocking film 110 and the first interlayer insulating film 108 are successively patterned so as to form each first contact 9, and then, the second interlayer insulating film 111 is formed, and each second contact 112 is subsequently formed in the second interlayer insulating film 111. In this method, however, in forming the first contact 9, formation of a barrier layer, deposition of a tungsten film for forming a contact and the CMP of the tungsten film should be successively performed, and therefore, there arises a problem that the UV blocking film 110 is partly removed in the CMP as described above.

Accordingly, the fabrication method described in this embodiment, namely, the method in which each first contact 9 reaching the corresponding bit line diffusion layer 3 is formed by forming a first contact opening in the first interlayer insulating film 8, the UV blocking film 10 is formed so as to cover the first interlayer insulating film 8 and the first contact 9, the second interlayer insulating film 11 is subsequently formed on the UV blocking film 10, and then each second contact 12 in contact with the corresponding first contact 9 is formed by forming a second contact opening in the second interlayer insulating film 11 and the UV blocking film 10, is an effective fabrication method for preventing the thickness reduction of the UV blocking film 10 otherwise caused during the fabrication process.

Embodiment 2

Embodiment 2 of the invention will now be described with reference to the accompanying drawings.

Figure 7A:
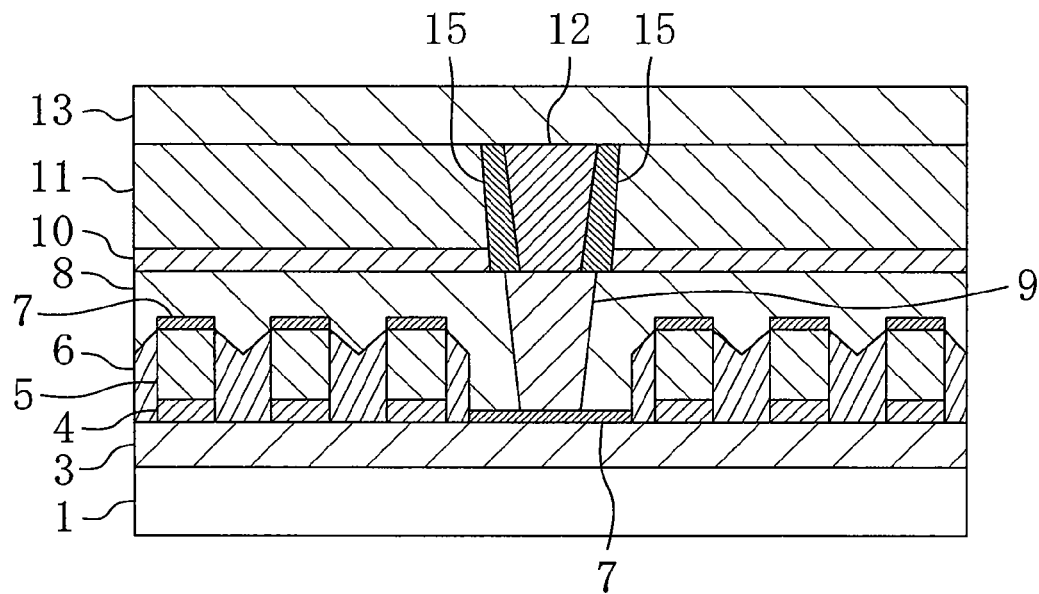
FIG. 7A is a cross-sectional view of a nonvolatile semiconductor memory device according to Embodiment 2 of the invention taken along the direction corresponding to line IIa-IIa of FIG. 1
Figure 7B:
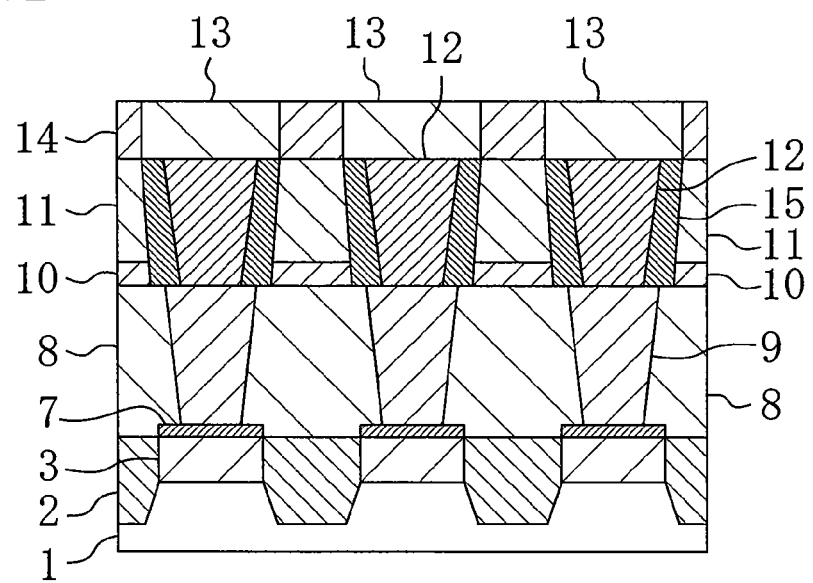
FIG. 7B is a cross-sectional view thereof taken along the direction corresponding to line IIb-IIb of FIG. 1.

FIGS. 7A and 7B show the cross-sectional structure of a memory cell array included in a nonvolatile semiconductor memory device according to Embodiment 2 of the invention, and FIG. 7A is a cross-sectional view taken on a line corresponding to line IIa-IIa of FIG. 1 and FIG. 7B is a cross-sectional view taken on a line corresponding to line IIb-IIb of FIG. 1. In FIGS. 7A and 7B, like reference numerals are used to refer to like elements shown in FIGS. 2A and 2B so as to omit the description.

As shown in FIGS. 7A and 7B, a difference from Embodiment 1 is that an inner lining film 15 made of an insulating material having a UV blocking property is formed on the outer side face of each second contact 12, namely, on the inner wall of each second contact opening formed in a second interlayer insulating film 11. In this case, the inner lining film 15 can be made of a single-layered film of, for example, silicon carbide (SiC), silicon nitride (SiN), silicon carbon nitride (SiCN) or silicon oxy-nitride (SiON), or a multilayered film including at least two of them. Accordingly, in Embodiment 2, the inner lining film 15 formed around each second contact 12 penetrates through a UV blocking film 10. In other words, a first contact 9 and the second contact 12 are separated from the UV blocking film 10 with the inner lining film 15 sandwiched therebetween. In this case, the inner lining film 15 covers at least an end portion of the UV blocking film 10 disposed on the side of the opening. In the case where fabrication process at 90 nm level is assumed as the design rule, the thickness of the inner lining film is not less than 5 nm and not more than 50 nm and is preferably approximately 10 nm.

First Fabrication Method of Embodiment 2

Now, a first method for fabricating the nonvolatile semiconductor memory device having the aforementioned structure will be described with reference to the accompanying drawings.

Figure 8A:
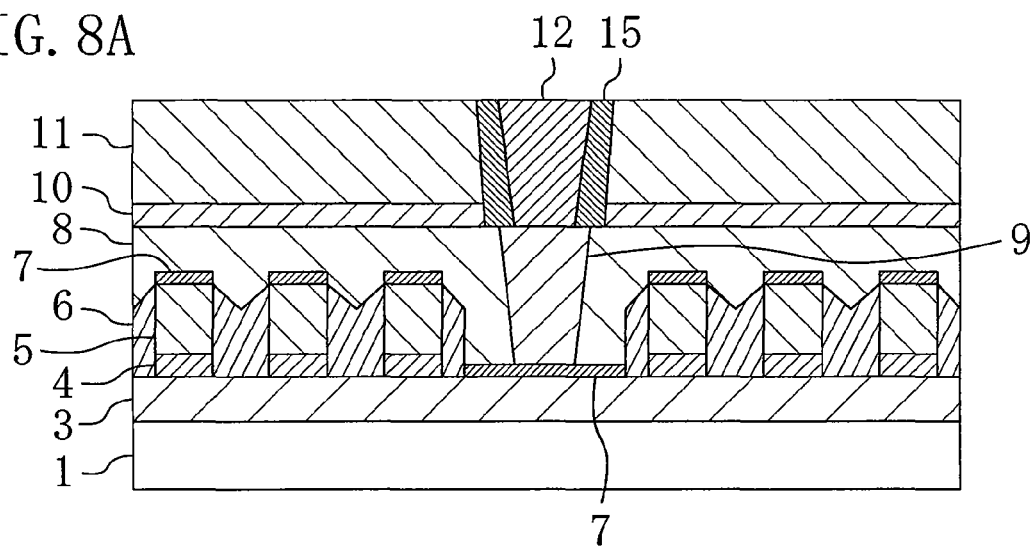
FIGS. 8A and 8B are cross-sectional views respectively taken along the directions corresponding to lines IIa-IIa and IIb-IIb of FIG. 1 for showing a procedure in a first method for fabricating the nonvolatile semiconductor memory device of Embodiment 2.

FIGS. 8A, 8B, 9A, 9B and 10 are cross-sectional views of a region including a memory cell array for showing procedures in the first method for fabricating the nonvolatile semiconductor memory device of Embodiment 2. FIG. 8A shows the cross-sectional structure taken on the line corresponding to line IIa-IIa of FIG. 1 and FIGS. 8B, 9A, 9B and 10 show the cross-sectional structure taken on the line corresponding to line IIb-IIb of FIG. 1.

Figure 8B:
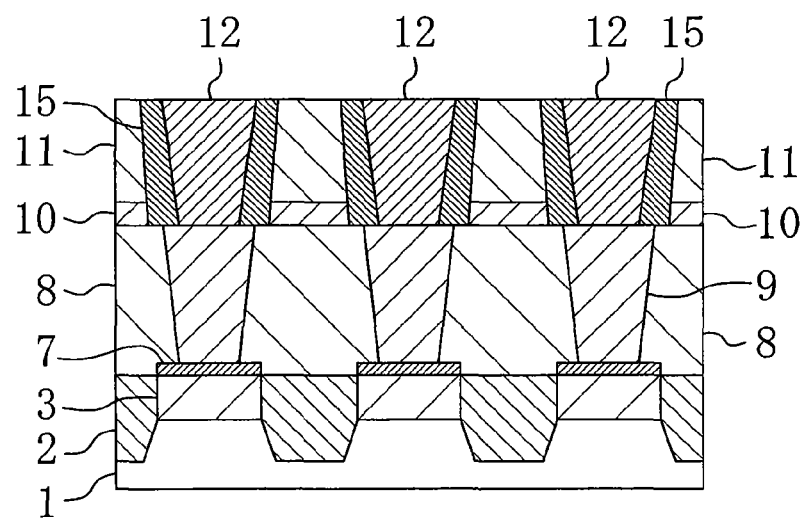

It is noted that procedures performed before the procedure shown in FIGS. 8A and 8B are the same as those performed up to the procedure of FIG. 4A described in Embodiment 1.

As shown in FIGS. 8A and 8B, a UV blocking film 10 of, for example, undoped polysilicon and a second interlayer insulating film 11 of NSG are successively deposited on a first interlayer insulating film 8 in which first contacts 9 have been formed. Subsequently, openings in each of which the first contact 9 formed in the first interlayer insulating film 8 is exposed are formed successively in the second interlayer insulating film 11 and the UV blocking film 10 by using a second contact forming mask (not shown). At this point, the whole top face of each first contact 9 is preferably exposed. Thus, the UV blocking film 10 is never in contact with the first contacts 9. Thereafter, an inner lining film 15 of, for example, SiC is formed on the inner wall of each opening formed in the UV blocking film 10 and the first interlayer insulating film 8. As a method for forming the inner lining film 15, the inner lining film 15 is deposited over the second interlayer insulating film 11 having the openings by the plasma CVD or low pressure CVD and the deposited inner lining film 15 is etched back so as to allow it to remain merely on the inner walls of the openings. Since the inner lining film 15 is thus provided on the inner wall of each opening formed in the second interlayer insulating film 11 and the UV blocking film 10, the UV blocking film is separated from each first contact 9 and each second contact 12.

At this point, the second contact forming mask (photomask) can be the same as a mask (photomask) used for forming the first contacts. Since a contact forming mask is generally expensive, a structure in which the first contacts 9 and the second contacts 12 can be formed by using the same mask is preferred from the viewpoint of fabrication cost reduction. Furthermore, when the same mask is used, an alignment shift derived from the fabrication of a mask can be avoided, and hence, the accuracy in aligning the second contacts 12 on the first contacts 9 is improved. Since the inner lining film 15 is provided in Embodiment 2, in the case where the same mask is used for forming the first contacts 9 and the second contacts 12, it is necessary to make the pattern of the second contact openings larger than the pattern of the first contact openings. This necessity can be satisfied by appropriately controlling, for example, exposure conditions for a resist pattern used for patterning the second contacts 12, etching conditions or cleaning conditions after the etching. As a method for controlling the opening diameter of a resist pattern, control of exposure in lithography is generally known. Alternatively, as a control method employed in the etching, for example, use of an etching gas including a gas capable of increasing the opening diameter of a resist, such as an oxygen gas or a fluorine-based gas like $SF_6$, is generally known. Alternatively, as a control method employed in the cleaning after the etching, processing with chemicals respectively reactive with the second interlayer insulating film 11 and the UV blocking film 10 is generally known. It is noted that these methods are merely illustratively described and that the conditions for forming the second contacts 12 are not particularly specified.

Thereafter, tungsten is deposited so as to fill each opening having the inner lining film 15 on the inner wall, and thus, the second contacts 12 of tungsten are formed. Also in this case, an unnecessary portion of the tungsten deposited on the second interlayer insulating film 11 is removed by the CMP or the like. It is noted that another insulating film made of, for example, silicon nitride and working as an etching stopper film may be formed on the first interlayer insulating film 8 including the first contacts 9 before forming the UV blocking film 10 also in Embodiment 2.

Figure 9A:
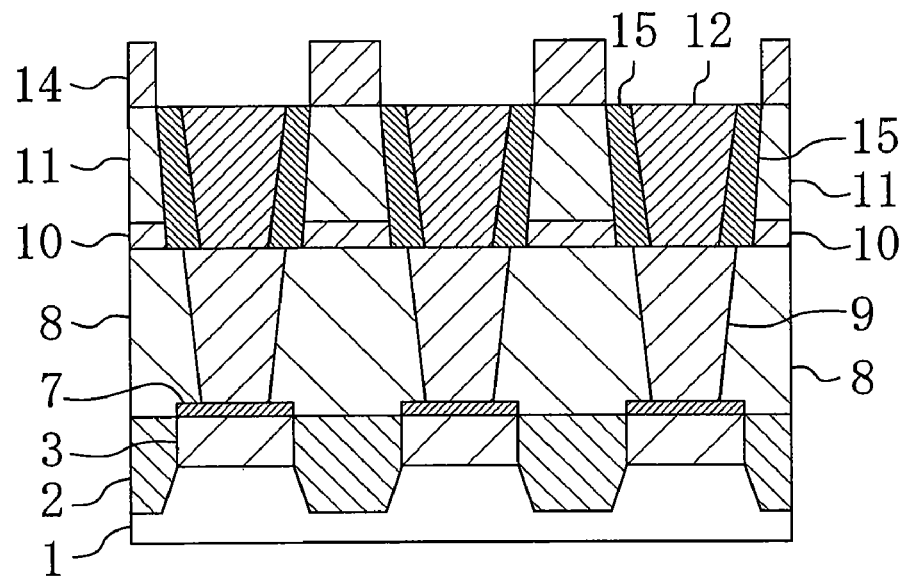
FIGS. 9A and 9B are cross-sectional views taken along the direction corresponding to line IIb-IIb of FIG. 1 for showing procedures performed after the procedure of FIGS. 8A and 8B in the first method for fabricating the nonvolatile semiconductor memory device of Embodiment 2.

Next, as shown in FIG. 9A, a metal interconnection insulating film 14 made of, for example, silicon oxy-carbide and having an opening pattern corresponding to an interconnection pattern is formed on the second interlayer insulating film 11. At this point, the opening pattern is formed so as to expose the second contacts 12. It is noted that the metal interconnection insulating film 14 may be made of a plurality of insulating films having different compositions such as silicon oxy-carbide and silicon carbon nitride.

Figure 9B:
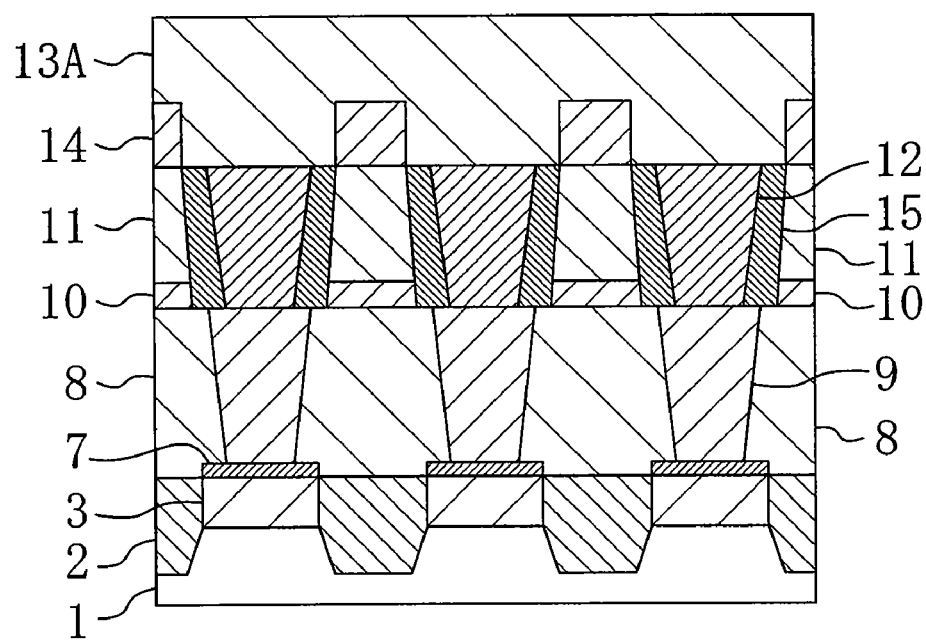

Next, as shown in FIG. 9B, a metal film 13A of copper used for forming a metal interconnection is deposited over the second interlayer insulating film 11 including the metal interconnection insulating film 14 by the copper plating.

Figure 10:
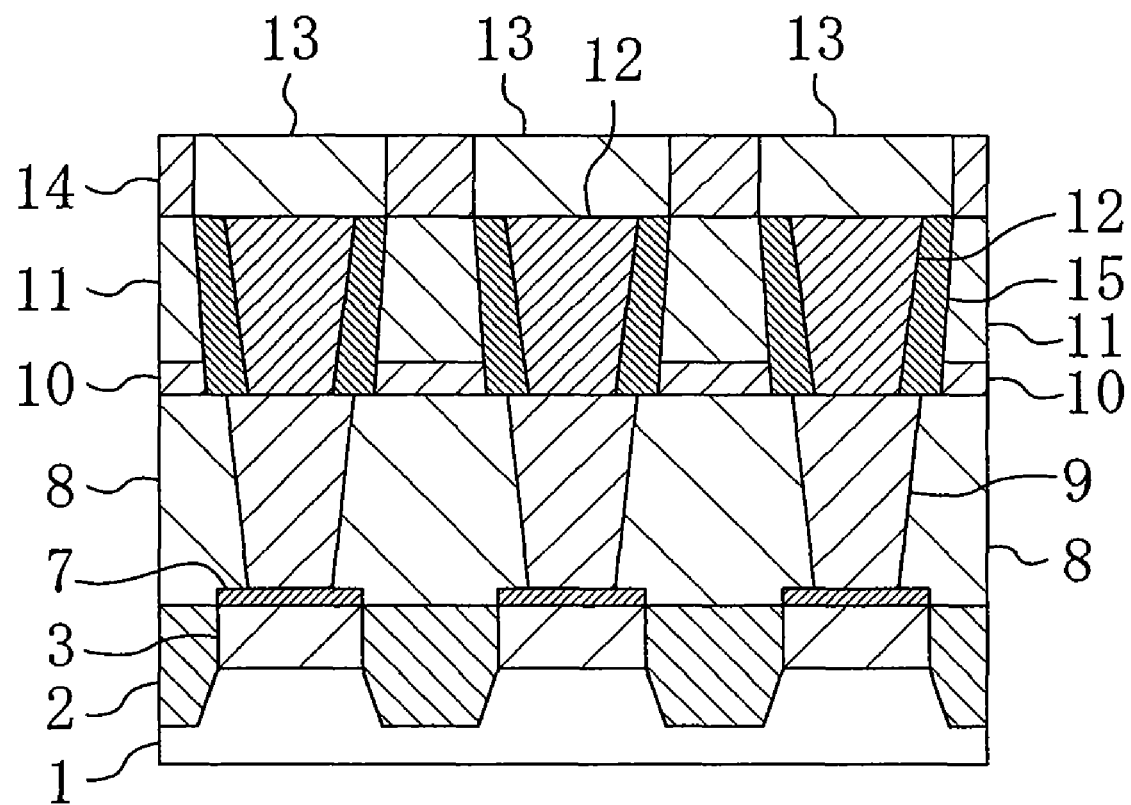
FIG. 10 is a cross-sectional view for showing another procedure performed after the procedures of FIGS. 9A and 9B in the first method for fabricating the nonvolatile semiconductor memory device of Embodiment 2.

Then, as shown in FIG. 10, the metal film 13A is polished and removed by, for example, the CMP until the metal interconnection insulating film 14 is exposed, and thus, the metal film 13A is formed into metal interconnections 13 in an opening pattern formed in the metal interconnection insulating film 14. Although the metal interconnections 13 are formed as copper interconnections obtained by the damascene method also in Embodiment 2, aluminum interconnections obtained by sputtering may be employed instead.

As described so far, in the first fabrication method of Embodiment 2, the same effects as those of Embodiment 1 can be attained, and in addition, since the UV blocking film 10 is insulated and separated from the first contacts 9, the UV blocking film 10 may be made of a conducting material that can be formed in a small thickness, such as tungsten, titanium, titanium nitride, aluminum, tantalum, ruthenium, vanadium, manganese or a compound including at least two of them. When such a conducting material is used, the processing can be eased and the fabrication cost can be reduced.

Although it is apprehended that UV may enter through a gap between the UV blocking film 10 and each first contact 9 or each second contact 12 in Embodiment 2 in the same manner as in Conventional Example 1, the amount of entering UV can be minimized by forming the inner lining film 15 in a self-alignment manner. Also, when the inner lining film 15 is made of an insulating film having a UV blocking property, UV can be definitely prevented from entering.

Second Fabrication Method of Embodiment 2

Now, a second fabrication method of Embodiment 2 will be described with reference to the accompanying drawings.

Figure 11A:
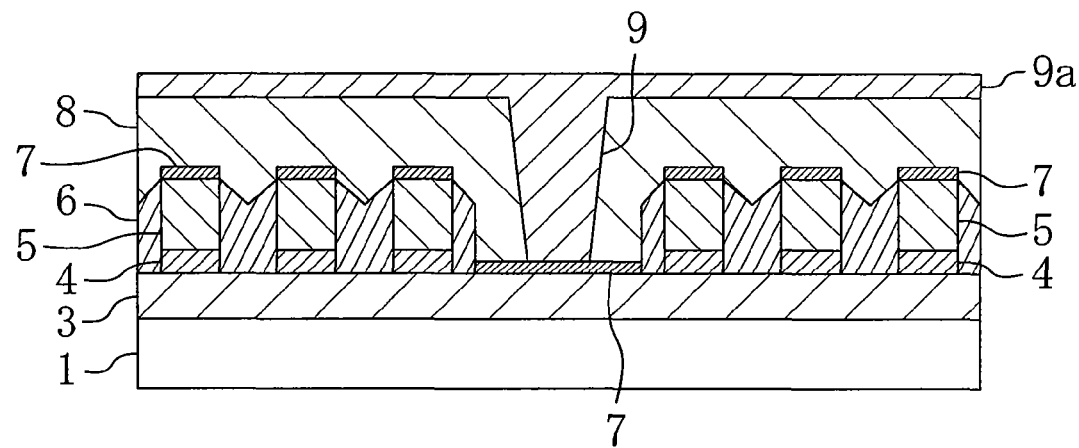
FIGS. 11A and 11B are cross-sectional views taken along the direction corresponding to line IIa-IIa of FIG. 1 for showing procedures in a second method for fabricating the nonvolatile semiconductor memory device of Embodiment 2.
Figure 11B:
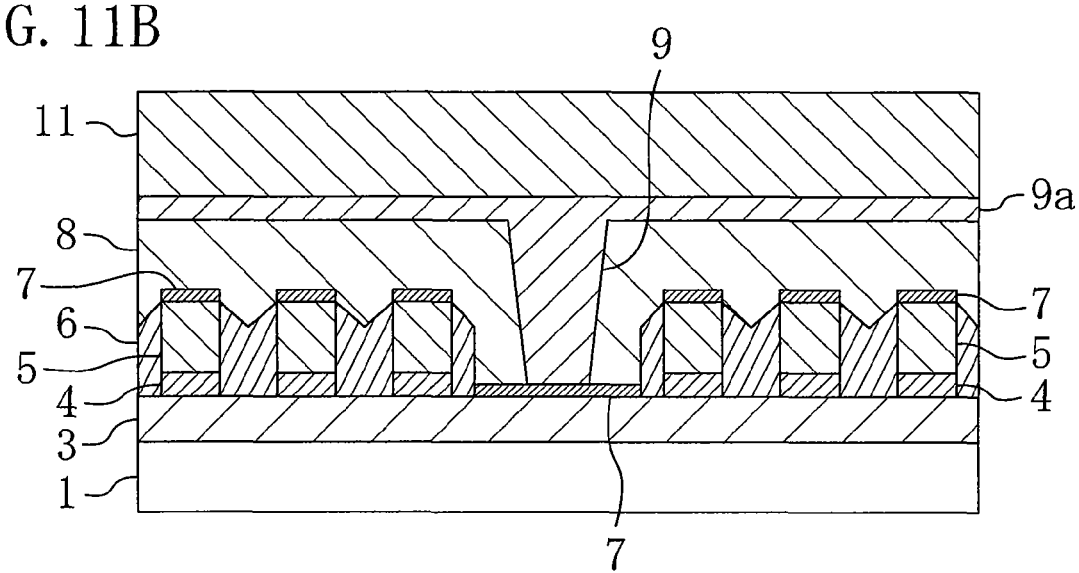

FIGS. 11A and 11B are cross-sectional views of the region including the memory cell array for showing procedures in the second method for fabricating the nonvolatile semiconductor memory device of Embodiment 2. FIGS. 11A and 11B show cross-sectional structures taken on a line corresponding to line IIa-IIa of FIG. 1.

Procedures performed before the procedures of FIGS. 11A and 11B are the same as those performed up to the procedure of FIG. 3C described in Embodiment 1.

After the procedure of FIG. 3C, openings in each of which a metal silicide 7 formed on a bit line diffusion layer 3 is exposed are formed in a first interlayer insulating film 8 by using a first contact forming mask (not shown) as shown in FIG. 11A. Subsequently, a conducting film having a UV blocking property such as tungsten (W) is deposited so as to fill the openings formed in the first interlayer insulating film 8, and thus, first contacts 9 made of tungsten are formed above the bit line diffusion layers 3. Thereafter, in removing an unnecessary portion of the tungsten deposited on the first interlayer insulating film 8 by the CMP or the like, the tungsten is allowed to remain in a thickness of 50 nm on the first interlayer insulating film 8 as a UV blocking film 9*a*.

Next, as shown in FIG. 11B, a second interlayer insulating film 11 is deposited on the UV blocking film 9*a*. Procedures performed thereafter are the same as those performed in the first fabrication method of Embodiment 2 and hence the description is omitted.

In this manner, in the second fabrication method of Embodiment 2, the first contacts 9 and the UV blocking film 9a are simultaneously formed, and hence, the fabrication cost can be reduced as compared with that of the first fabrication method of Embodiment 2.

In the case where a conducting material is used for the UV blocking film 9a as in the second fabrication method, a portion of the first interlayer insulating film 8 disposed around the top face of each first contact 9 is preferably exposed from the corresponding second contact opening formed in the second interlayer insulating film 11 as shown in FIG. 8A. Thus, the UV blocking film 9a can be definitely insulated from the first contacts 9.

Embodiment 3

Embodiment 3 of the invention will now be described with reference to the accompanying drawings.

Figure 12A:
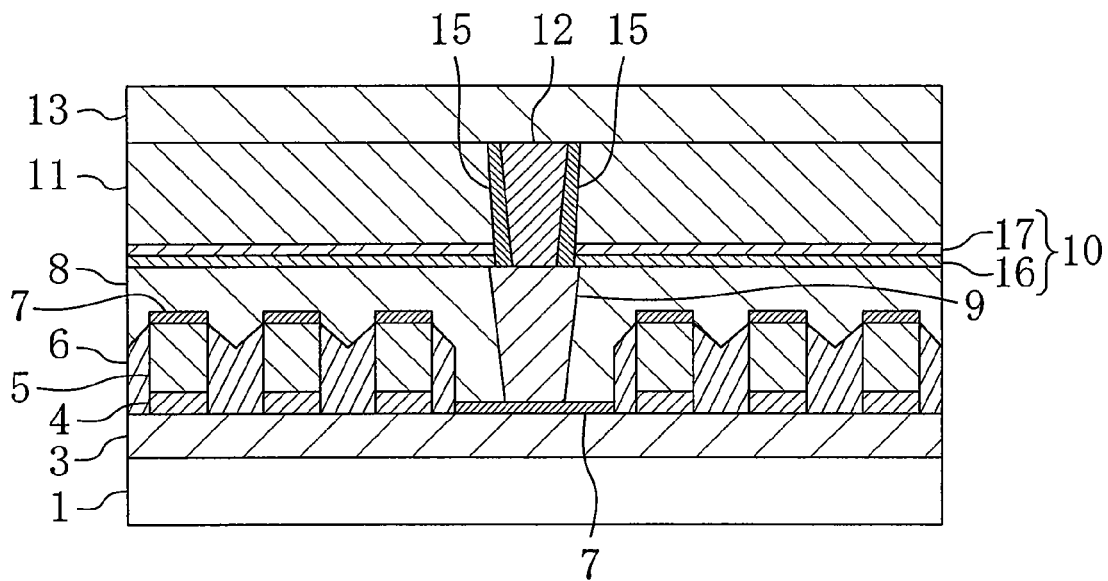
FIGS. 12A and 12B are cross-sectional views of a nonvolatile semiconductor memory device according to Embodiment 3 of the invention respectively taken along the directions corresponding to lines IIa-IIa and IIb-IIb of FIG. 1.
Figure 12B:
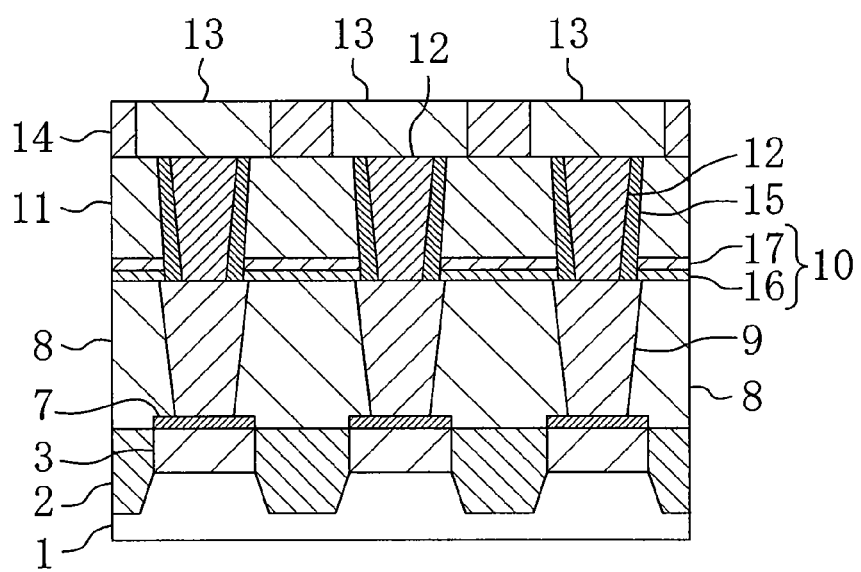

FIGS. 12A and 12B show the cross-sectional structure of a memory cell array included in a nonvolatile semiconductor memory device according to Embodiment 3, and FIG. 12A is a cross-sectional view taken on a line corresponding to line IIa-IIa of FIG. 1 and FIG. 12B is a cross-sectional view taken on a line corresponding to line IIb-IIb of FIG. 1. It is noted that like reference numerals are used in FIGS. 12A and 12B to refer to like elements shown in FIGS. 2A, 2B, 7A and 7B so as to omit the description.

As shown in FIGS. 12A and 12B, differences from Embodiment 2 are that a UV blocking film 10 has a multilayered structure including a lower UV blocking film 16 and an upper UV blocking film 17 disposed thereon and that at least the lower UV blocking film 16 is made of an insulating material. In this case, the lower UV blocking film 16 can be made of, for example, a single-layered film of silicon carbide (SiC), silicon nitride (SiN), silicon carbon nitride (SiCN) or silicon oxy-nitride (SiON) or a multilayered film including at least two of them. Furthermore, the upper UV blocking film 17 can be made of silicon (Si), tungsten (W), titanium (Ti), titanium nitride (TiN), aluminum (Al), tantalum (Ta), ruthenium (Ru), vanadium (V), manganese (Mn) or a compound including at least two of them. It is noted that the upper UV blocking film 17 need not always be made of a conducting material but is preferably made of a conducting material from the viewpoint of thickness reduction and processability as described above.

In Embodiment 3, the lower UV blocking film 16 is made of an insulating material, such as silicon oxy-nitride, with a thickness of 50 nm, and the upper UV blocking film 17 is made of a conducting material, such as titanium nitride, with a thickness of 50 nm.

As a characteristic of Embodiment 3, since the lower UV blocking film 16 is made of a conducting material, there is no need to completely expose the top face of each first contact 9 on the bottom of an opening in forming, in a second interlayer insulating film 11, the opening for a second contact 12 to be electrically connected to the first contact 9. In other words, an end portion of the lower UV blocking film 16 on the side of the opening may be in contact with the top face of the first contact 9.

Now, a method for fabricating the nonvolatile semiconductor memory device having the aforementioned structure will be described with reference to the accompanying drawings.

Figure 13A:
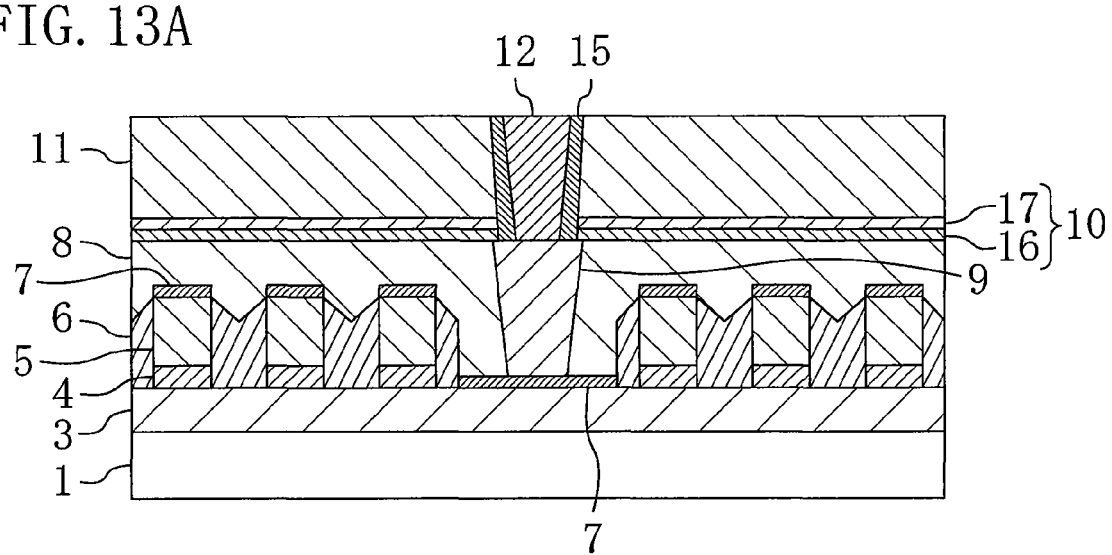
FIGS. 13A and 13B are cross-sectional views respectively taken along the directions corresponding to lines IIa-IIa and IIb-IIb of FIG. 1 for showing a procedure in a method for fabricating the nonvolatile semiconductor memory device of Embodiment 3.

FIGS. 13A, 13B, 14A, 14B and 15 are cross-sectional views of a region including a memory cell array for showing procedures in the method for fabricating the nonvolatile semiconductor memory device of Embodiment 3. FIG. 13A is a cross-sectional view taken on the line corresponding to the line IIa-IIa of FIG. 1, and FIGS. 13B, 14A, 14B and 15 are cross-sectional views taken on the line corresponding to the line IIb-IIb of FIG. 1.

Figure 13B:
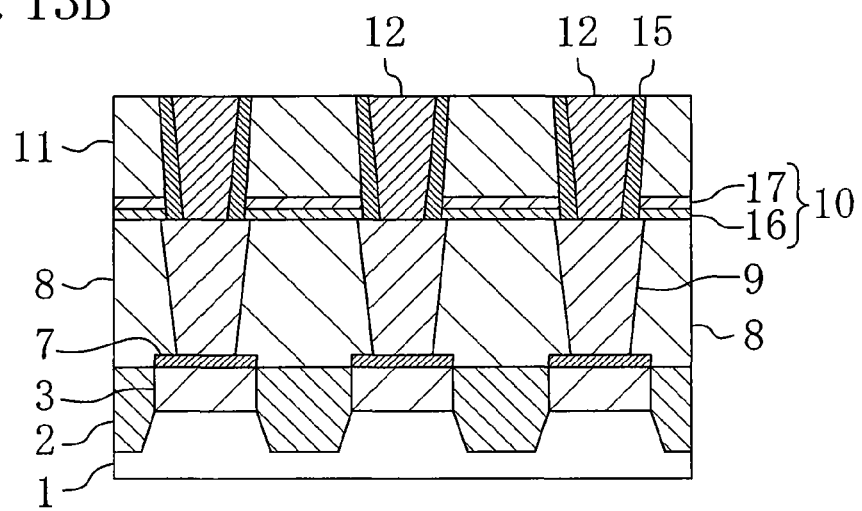

Procedures performed before the procedure of FIGS. 13A and 13B are the same as those performed up to the procedure of FIG. 4A of the fabrication method described in Embodiment 1.

As shown in FIGS. 13A and 13B, a lower UV blocking film 16 of, for example, silicon oxy-nitride, an upper UV blocking film 17 of titanium nitride and a second interlayer insulating film 11 of NSG are successively deposited on a first interlayer insulating film 8 in which first contacts 9 have been formed. Subsequently, openings in each of which the first contact 9 formed in the first interlayer insulating film 8 is exposed are formed in the second interlayer insulating film 11, the upper UV blocking film 17 and the lower UV blocking film 16 by using a second contact forming mask (not shown). In Embodiment 3, the top face of each first contact 9 need not be always wholly exposed. Subsequently, a silicon nitride film to be used for forming an inner lining film is deposited over the second interlayer insulating film 11 having the openings by, for example, the plasma CVD or the like, and then, the deposited silicon nitride film is etched back so as to allow a portion thereof to remain on the inner wall of each opening. Thus, an inner lining film 15 made of silicon nitride is formed.

Thereafter, tungsten is deposited so as to fill each opening in which the inner lining film 15 has been formed, so as to form a second contact 12 made of tungsten. Also in this case, an unnecessary portion of the tungsten deposited on the second interlayer insulating film 11 is removed by the CMP or the like. It is noted that another insulating film made of, for example, silicon nitride and working as an etching stopper film may be formed on the first interlayer insulating film 8 including the first contacts 9 before forming the lower UV blocking film 16 also in Embodiment 3. Furthermore, the second contact forming mask (photomask) is preferably the same as a mask (photomask) used for forming the first contacts as described above.

Figure 14A:
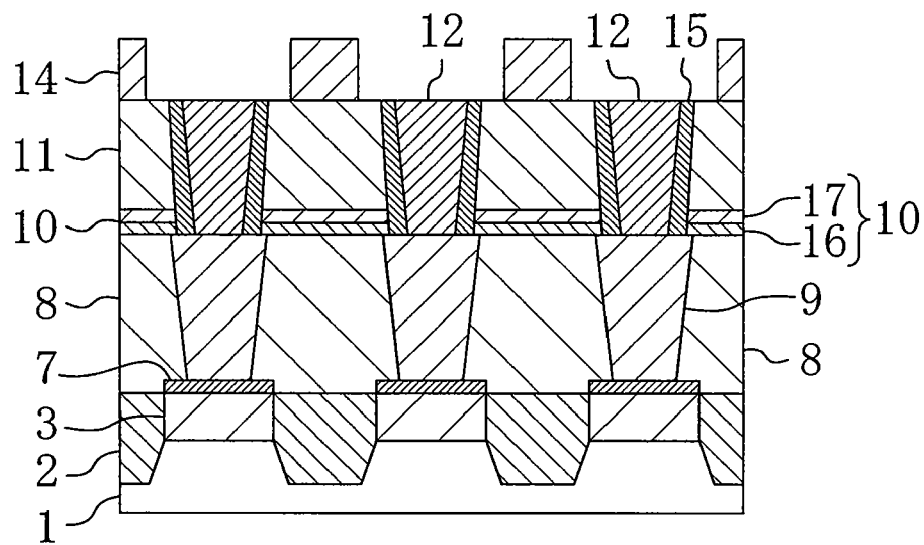
FIGS. 14A and 14B are cross-sectional views taken along the direction corresponding to line IIb-IIb of FIG. 1 for showing procedures performed after the procedure of FIGS. 13A and 13B in the method for fabricating the nonvolatile semiconductor memory device of Embodiment 3.

Next, as shown in FIG. 14A, a metal interconnection insulating film 14 made of, for example, silicon oxy-carbide and having an opening pattern corresponding to an interconnection pattern is formed on the second interlayer insulating film 11. At this point, the opening pattern is formed so as to expose the second contacts 12. The metal interconnection insulating film 14 may be made of a plurality of insulating films having different compositions such as silicon oxy-carbide and silicon carbon nitride.

Figure 14B:
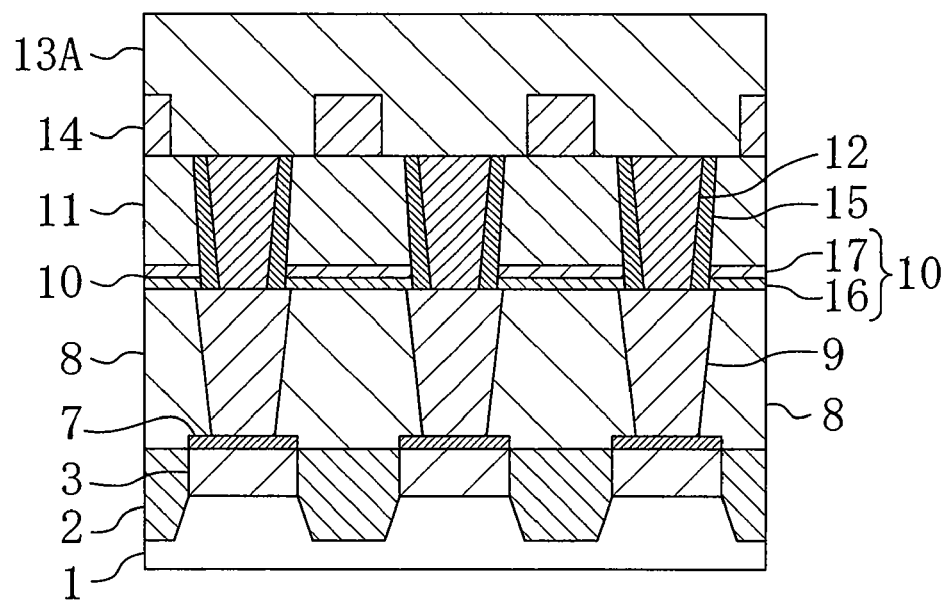

Then, as shown in FIG. 14B, a metal film 13A of copper for forming metal interconnections is deposited over the second interlayer insulating film 11 including the metal interconnection insulating film 14 by the copper plating.

Figure 15:
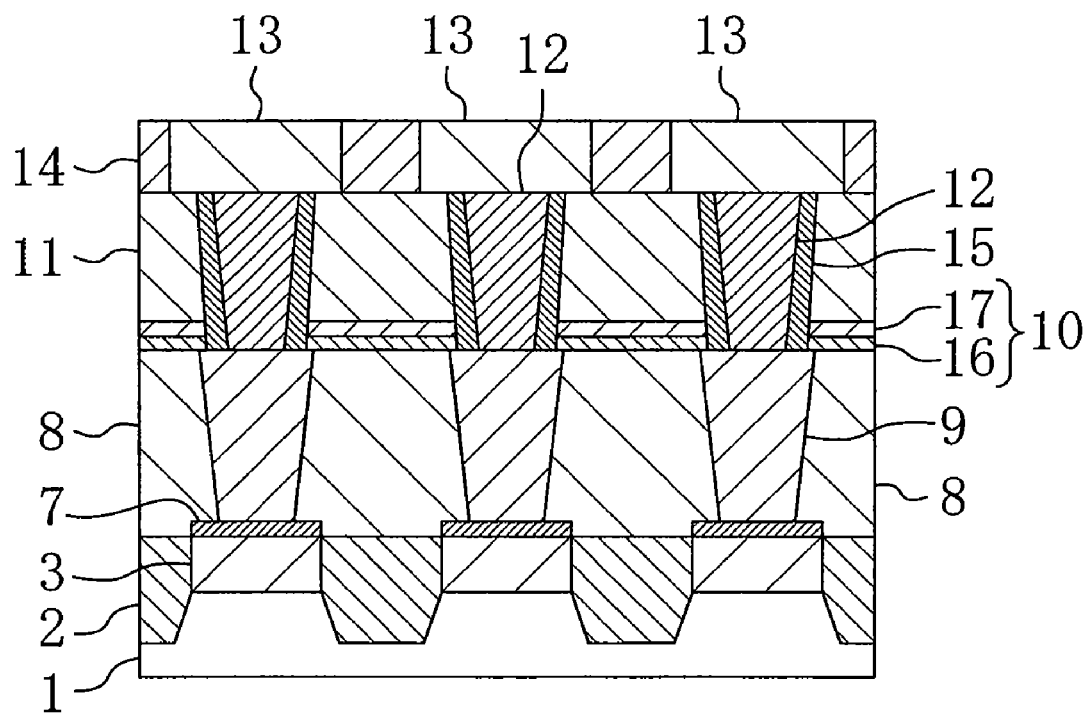
FIG. 15 is a cross-sectional view for showing a procedure performed after the procedures of FIGS. 14A and 14B in the method for fabricating the nonvolatile semiconductor memory device of Embodiment 3.
Figure 16:
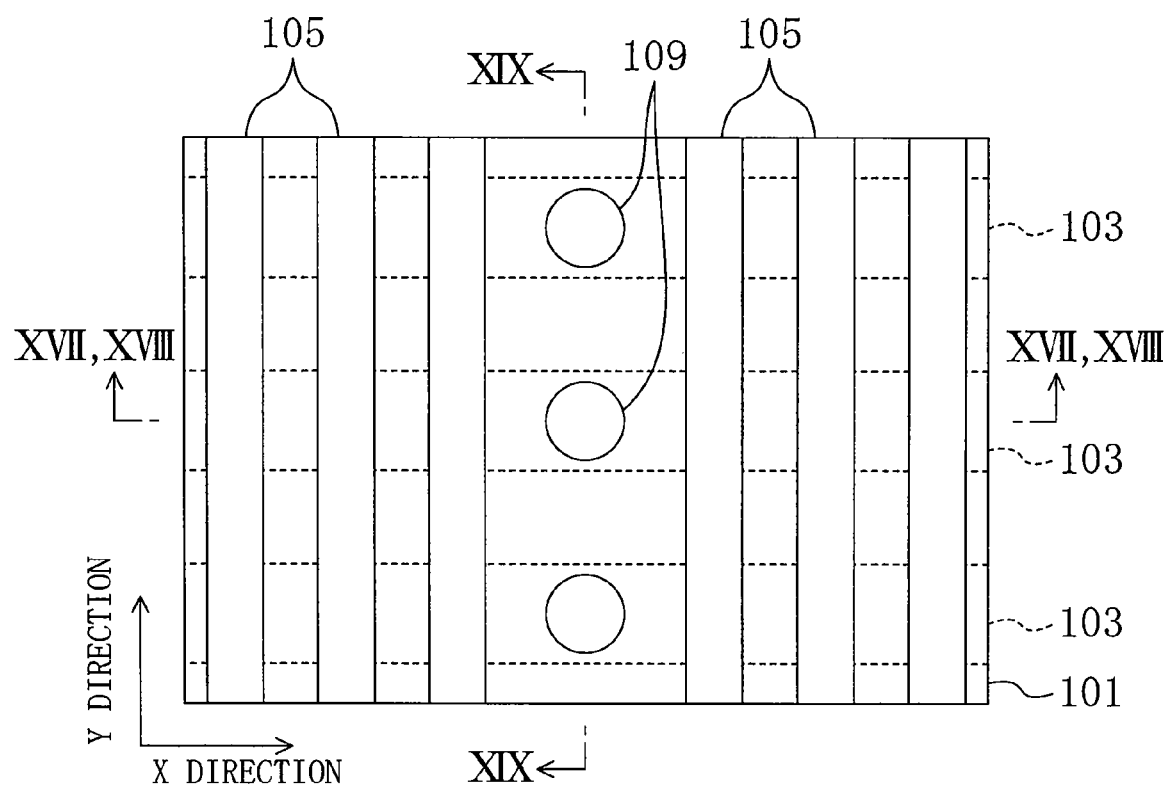
FIG. 16 is a plan view of a memory cell array according to Conventional Example 1.

Next, as shown in FIG. 15, the metal film 13A is polished and removed by, for example, the CMP until the metal interconnection insulating film 14 is exposed, so as to form the metal film 13A into metal interconnections 13 in an opening pattern formed in the metal interconnection insulating film 14. Although the metal interconnections 13 are formed as copper interconnections obtained by the damascene method also in Embodiment 3, aluminum interconnections obtained by the sputtering may be employed instead.

As described so far, in the fabrication method of Embodiment 3, the same effects as those of Embodiment 1 can be attained, and in addition, since the UV blocking film 10 includes an insulating film as the lower UV blocking film 16, the first contacts 9 can be easily and definitely insulated and separated from the upper UV blocking film 17 even if the upper blocking film 17 is made of a conducting material.

Moreover, since there is no need to make the diameter of each second contact opening formed in the second interlayer insulating film 11 larger than the top face of each first contact 9, Embodiment 3 is applicable to a finer layout rule. In other words, since the lower UV blocking film 16 is made of an insulating material, the diameter of the opening formed in the second interlayer insulating film 11 may be so small that the first contact 9 is in contact with the lower UV blocking film 16. Accordingly, since the diameter of each opening formed in the second interlayer insulating film 11 can be made smaller to the same extent to that employed in Embodiment 1, Embodiment 3 is applicable to a finer layout rule.

Although it is apprehended that UV may slightly enter through a gap between the UV blocking film 10 and each first contact 9 or each second contact 12 also in Embodiment 3 in the same manner as in Conventional Example 1, the amount of entering UV can be minimized by forming the inner lining film 15 in a self-alignment manner. Also, when the inner lining film 15 is made of an insulating film having a UV blocking property, UV can be definitely prevented from entering.

As described above, according to the nonvolatile semiconductor memory device and the method for fabricating the same of this invention, UV generated during the fabrication can be prevented from irradiating a memory cell so as to stabilize the initial characteristics of the memory cell, and the invention is useful particularly for a MONOS nonvolatile semiconductor memory device and a method for fabricating the same.

What is claimed is:

1. A nonvolatile semiconductor memory device comprising:
   a plurality of bit line diffusion layers formed selectively in an upper portion of a semiconductor region and extending along a first direction;
   a plurality of gate structures formed on the semiconductor region, extending along a second direction perpendicular to the first direction and each containing a charge trapping film including an insulating film for trapping charge and a gate electrode formed on the charge trapping film;
   a first interlayer insulating film formed over the plurality of gate structures and having a plurality of openings in which the plurality of bit line diffusion layers are respectively exposed;
   a plurality of first contacts respectively formed in the openings of the first interlayer insulating film and respectively electrically connected to the plurality of bit line diffusion layers;
   a UV blocking film formed over the first interlayer insulating film and having a plurality of openings in which the plurality of first contacts are respectively exposed;
   a second interlayer insulating film formed at least over the UV blocking film and having a plurality of openings in which the plurality of first contacts are respectively exposed;
   a plurality of second contacts respectively formed in the plurality of openings of the second interlayer insulating film and the plurality of openings of the UV blocking film and respectively electrically connected to the plurality of first contacts, and
   inner lining films that are formed on inner walls of at least the plurality of openings of the UV blocking film out of the plurality of openings of the second interlayer insulating film and the plurality of openings of the UV blocking film for separating the UV blocking film from the plurality of first contacts and the plurality of second contacts,
   wherein the inner lining films are made of a single-layered film of silicon carbide, silicon nitride, silicon carbon nitride or silicon oxy-nitride or a multilayered film including at least two of silicon carbide, silicon nitride, silicon carbon nitride and silicon oxy-nitride.

2. The nonvolatile semiconductor memory device of claim 1, wherein a bottom face of each of the plurality of second contacts is disposed in a position included in a top face of a corresponding one of the plurality of first contacts.

3. The nonvolatile semiconductor memory device of claim 1,
   wherein the UV blocking film includes at least two layers having different compositions, and
   a lowermost layer of the at least two layers is made of an insulating material.

4. The nonvolatile semiconductor memory device of claim 3, wherein the lowermost layer of the UV blocking film is made of a single-layered film of silicon carbide, silicon nitride, silicon carbon nitride or silicon oxy-nitride or a multilayered film including at least two of silicon carbide, silicon nitride, silicon carbon nitride and silicon oxy-nitride.

5. The nonvolatile semiconductor memory device of claim 3, wherein a layer apart from the lowermost layer of the UV blocking film including the at least two layers is made of a conducting material.

6. The nonvolatile semiconductor memory device of claim 5, wherein the layer apart from the lowermost layer of the UV blocking film is made of one of or a compound including at least two of silicon, tungsten, titanium, titanium nitride, aluminum, tantalum, ruthenium, vanadium and manganese.

7. The nonvolatile semiconductor memory device of claim 3, wherein each of the inner lining films has a bottom face with an outer periphery thereof disposed inside a top face of a corresponding one of the plurality of first contacts.

8. The nonvolatile semiconductor memory device of claim 1, wherein each of the inner lining films has a bottom face with an outer periphery thereof disposed outside a top face of a corresponding one of the plurality of first contacts.

9. The nonvolatile semiconductor memory device of claim 1, wherein each of the inner lining films has a thickness not less than 5 nm and not more than 50 nm.

10. The nonvolatile semiconductor memory device of claim 1, wherein the charge trapping film includes a multi-layered film of silicon oxide and silicon nitride.

11. The nonvolatile semiconductor memory device of claim 1, wherein the UV blocking film is made of at least one of polysilicon, silicon carbide and silicon nitride.

12. The nonvolatile semiconductor memory device of claim 1, wherein the UV blocking film is made of one of or a compound including at least two of silicon, tungsten, titanium, titanium nitride, aluminum, tantalum, ruthenium, vanadium and manganese.

* * * * *